US008503254B2

(12) United States Patent
Park

(10) Patent No.: US 8,503,254 B2
(45) Date of Patent: Aug. 6, 2013

(54) SEMICONDUCTOR MEMORY DEVICE, SEMICONDUCTOR SYSTEM INCLUDING THE SEMICONDUCTOR MEMORY DEVICE, AND METHOD FOR OPERATING THE SEMICONDUCTOR MEMORY DEVICE

(71) Applicant: SK hynix Inc., Gyeonggi-do (KR)

(72) Inventor: Jung-Hoon Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 13/662,062

(22) Filed: Oct. 26, 2012

(65) Prior Publication Data

US 2013/0039143 A1  Feb. 14, 2013

Related U.S. Application Data

(62) Division of application No. 12/832,815, filed on Jul. 8, 2010, now Pat. No. 8,320,205.

(30) Foreign Application Priority Data

Apr. 30, 2010 (KR) .......................... 10-2010-0040971

(51) Int. Cl.
*G11C 7/06* (2006.01)

(52) U.S. Cl.
USPC .................................. 365/189.07; 365/230.06

(58) Field of Classification Search
USPC ........................................ 365/189.07, 230.06
See application file for complete search history.

(56) References Cited

U.S. PATENT DOCUMENTS

| 2001/0040830 | A1* | 11/2001 | Matsui et al. ................. 365/200 |
| 2006/0083068 | A1* | 4/2006 | Ahn et al. ................. 365/185.18 |
| 2011/0231690 | A1* | 9/2011 | Honda ..................... 365/189.09 |
| 2012/0002478 | A1* | 1/2012 | Isobe et al. .............. 365/185.17 |

* cited by examiner

*Primary Examiner* — Tuan T. Nguyen
(74) *Attorney, Agent, or Firm* — IP & T Group LLP

(57) ABSTRACT

A semiconductor memory device includes a first data input/output unit configured to receive a normal training data, whose data window is scanned based on an edge of a source clock, in response to a training input command, and output a data in a state where an edge of the data window is synchronized with the edge of the source clock in response to a training output command, and a second data input/output unit configured to receive a recovery information training data, whose data window is scanned based on the edge of the source clock, in response to the training input command, and output a data in a state where an edge of a data window is synchronized with the edge of the source clock in response to the training output command.

30 Claims, 17 Drawing Sheets a state shifted a little bit to the right/left, and thus the data inputted/outputted between the data processing apparatus and the semiconductor memory device may be recognized in a state shifted backward or forward by one space from an intended state, which may raise concern.

The above-described concern may become more serious as the transmission frequency of the data inputted/outputted between the data processing apparatus and the semiconductor memory device increases. This is because as the transmission frequency of the data inputted/outputted between the data processing apparatus and the semiconductor memory device increases, the length of a data window of the transferred data decreases. Therefore, when the operation temperature of the semiconductor system is altered or the operation power is changed, the data inputted/outputted between the data processing apparatus and the semiconductor memory device may be recognized in a state of being shifted backward or forward by one space from an intended state.

SEMICONDUCTOR MEMORY DEVICE, SEMICONDUCTOR SYSTEM INCLUDING THE SEMICONDUCTOR MEMORY DEVICE, AND METHOD FOR OPERATING THE SEMICONDUCTOR MEMORY DEVICE

CROSS-REFERENCE TO RELATED APPLICATIONS

This application is a division of U.S. patent application Ser. No. 12/832,815 filed on Jul. 8, 2010, which claims priority of Korean Patent Application No. 10-2010-0040971 filed on Apr. 30, 2010. The disclosure of each of the foregoing applications is incorporated herein by reference in its entirety.

BACKGROUND OF THE INVENTION

Exemplary embodiments of the present invention relate to a semiconductor designing technology, and more particularly, to a circuit for training and correcting phases of a write clock and a write data applied to a semiconductor memory device and a method thereof.

A semiconductor memory device stores data in a system composed of a plurality of semiconductor devices. When a data processing apparatus, such as a memory control unit (MCU), requests data, the semiconductor memory device outputs a data corresponding to an address inputted from an apparatus requesting the data, or stores a data provided by the data requesting apparatus at a location corresponding to the address.

Meanwhile, when an operation temperature of a semiconductor system is altered or an operation power is changed while a data is transferred between the data processing apparatus and the semiconductor memory device, there may be a concern regarding the phase of a data inputted/outputted between the data processing apparatus and the semiconductor memory device.

To be specific, the data inputted/outputted between the data processing apparatus and the semiconductor memory device is inputted/outputted in synchronization with a clock for transferring the data. When the operation temperature of the semiconductor system is altered or an operation power is changed while the data is inputted/outputted between the data processing apparatus and the semiconductor memory device, the phase of the data inputted/outputted between the data processing apparatus and the semiconductor memory device and the phase of a clock for transferring the data may differ, and thus, a data having a different phase from the phase of the data at a moment when the data begins being transferred may be outputted. As a result, the data inputted/outputted between the data processing apparatus and the semiconductor memory device may be recognized in a state of being shifted backward or forward by one space from an intended state, which may raise concern. In other words, the data may not be transferred normally.

For example, a process where a data is transferred from the data processing apparatus to the semiconductor memory device will be described. Although a data begins to be transferred to the semiconductor memory device in synchronization with the center of a clock for transferring the data from the data processing apparatus, if the operation temperature of the semiconductor system is altered or the operation power is changed, the phase of the data may be changed to be different from the phase of the clock for transferring the data during the data transferring process. Therefore, the data received by the semiconductor memory device is not synchronized with the center of the clock for transferring the data and may be of a

SUMMARY OF THE INVENTION

Exemplary embodiments of the present invention are directed to a circuit that may input/output a data stably all the time between a semiconductor memory device controller and a semiconductor memory device, regardless of whether the phase of the data is changed due to a change in the operation temperature or operation power of a semiconductor system when the data is inputted/outputted between the semiconductor memory device controller and the semiconductor memory device.

In accordance with an exemplary embodiment of the present invention, a semiconductor memory device includes a first data input/output unit configured to receive a normal training data, whose data window is scanned based on an edge of a source clock, in response to a training input command, and output a data in a state where an edge of the data window is synchronized with the edge of the source clock in response to a training output command, and a second data input/output unit configured to receive a recovery information training data, whose data window is scanned based on the edge of the source clock, in response to the training input command, and output a data in a state where an edge of a data window is synchronized with the edge of the source clock in response to the training output command.

The first data input/output unit may receive a normal data in a state where a center of a data window is synchronized with the edge of the source clock in response to a write command, and output a data in a state where an edge of the data window is synchronized with the edge of the source clock in response to a read command. The second data input/output unit may receive a recovery information data whose edge of a data window is synchronized with the edge of the source clock in response to a predetermined command, which is not the training input command or the training output command, and output a data whose edge of a data window is synchronized with the edge of the source clock after a predetermined time.

In accordance with another exemplary embodiment of the present invention, a semiconductor system including a semiconductor memory device and a semiconductor memory device controller between which a normal data and a recovery information data are transferred includes the semiconductor memory device controller configured to compare a recovery information training data with a feedback recovery information training data to produce a comparison result, and control a phase of the recovery information data transferred to the semiconductor memory device based on the comparison result, and the semiconductor memory device configured to receive the recovery information training data from the semiconductor memory device controller at a predetermined first moment and transfer the feedback recovery information training data to the semiconductor memory device controller at a predetermined second moment.

The semiconductor memory device controller may compare a normal training data with a feedback normal training data to produce a comparison result, and may control a phase of the normal data transferred to the semiconductor memory device based on the comparison result. The semiconductor memory device may receive the normal training data from the semiconductor memory device controller at the first moment, and may transfer the feedback normal training data at the second moment. The semiconductor memory device controller may compare the recovery information data with the feedback recovery information data to produce a comparison result, and controls a phase of the normal data transferred to the semiconductor memory device based on the comparison result. The semiconductor memory device may receive the recovery information data from the semiconductor memory device controller at the first moment, and may transfer the feedback recovery information data to the semiconductor memory device controller after a predetermined time.

In accordance with yet another exemplary embodiment of the present invention, a semiconductor system includes a semiconductor memory device controller configured to control a phase of a recovery information data transferred to the semiconductor memory device in a normal mode in response to a feedback recovery information training data transferred from the semiconductor memory device based on a recovery information training data transferred to the semiconductor memory device in a training mode, and a semiconductor memory device configured to store the recovery information training data transferred from the semiconductor memory device controller in the training mode for a first time period and feed-back the stored recovery information training data as the feedback recovery information training data, and to store the recovery information data transferred from the semiconductor memory device controller in the normal mode for a second time period and feed-back the stored recovery information data as the feedback recovery information data.

In accordance with still another exemplary embodiment of the present invention, a method for operating a semiconductor memory device includes applying a training input command, applying a normal training data and a recovery information training data at a first moment, after the applying of the training input command, by scanning each data window based on an edge of a source clock, applying a training output command, outputting the received normal training data and the received recovery information training data at a second moment in a state where an edge of a data window is synchronized with the edge of the source clock, after the applying of the training output command.

The method may further include applying a write command, applying a read command, applying a first normal data at the first moment after the applying of the write command in a state where a center of a data window is synchronized with the edge of the source clock, and outputting a second normal data stored inside at the second moment after the applying of the read command in a state where an edge of a data window is synchronized with the edge of the source clock. The method may further include applying a predetermined command, and receiving a recovery information data in a state where an edge of a data window is synchronized with the edge of the source clock at the first moment, after the applying of the write command, the read command, and the predetermined command, and outputting the applied data in a state where edges of data windows are synchronized with the edge of the source clock after a predetermined time.

In accordance with still another exemplary embodiment of the present invention, a method for operating a semiconductor system including a semiconductor memory device and a semiconductor memory device controller includes transferring a training input command generated in the semiconductor memory device controller to the semiconductor memory device and transferring a recovery information training data generated in the semiconductor memory device controller to the semiconductor memory device at a first time by scanning a data window based on an edge of a source clock, storing the recovery information training data transferred to the semiconductor memory device inside the semiconductor memory device, transferring a training output command generated in the semiconductor memory device controller to the semiconductor memory device and outputting the stored recovery information training data as a feedback recovery information training data to the semiconductor memory device controller at a second time in a state that an edge of a data window is synchronized with the edge of the source clock, and comparing a data value of the feedback recovery information training data outputted to the semiconductor memory device controller with the recovery information training data inside the semiconductor memory device controller to produce a comparison result, and controlling a phase of a recovery information data generated in the semiconductor memory device controller and transferred to the semiconductor memory device based on the comparison result.

The method may further include transferring a write command generated in the semiconductor memory device controller to the semiconductor memory device and transferring a first normal data generated in the semiconductor memory device controller to the semiconductor memory device at the first time in a state where a center of a data window is synchronized with the edge of the source clock, and transferring a read command generated in the semiconductor memory device controller to the semiconductor memory device and transferring a second normal data stored inside the semiconductor memory device to the semiconductor memory device controller after the second time in a state where an edge of a data window is synchronized with the edge of the source clock.

The method may further include transferring a predetermined command generated in the semiconductor memory device controller, including the write command and the read command and excluding the training input command and the training output command to the semiconductor memory device, and transferring the recovery information data generated in the semiconductor memory device controller to the semiconductor memory device after the first time in a state where an edge of a data window is synchronized with the edge of the source clock, storing the recovery information data transferred to the semiconductor memory device inside the semiconductor memory device, transferring the recovery information data stored in the semiconductor memory device as a feedback recovery information data to the semiconductor memory device controller in a state where an edge of a data window is synchronized with the edge of the source clock, after the storing of the recovery information data is completed and a predetermined time elapses, and comparing a data value of the feedback recovery information data transferred to the semiconductor memory device controller with the recovery information data inside the semiconductor memory device controller to produce a comparison result, and controlling a phase of the first normal data based on the comparison result.

DESCRIPTION OF SPECIFIC EMBODIMENTS

Figure 1A:
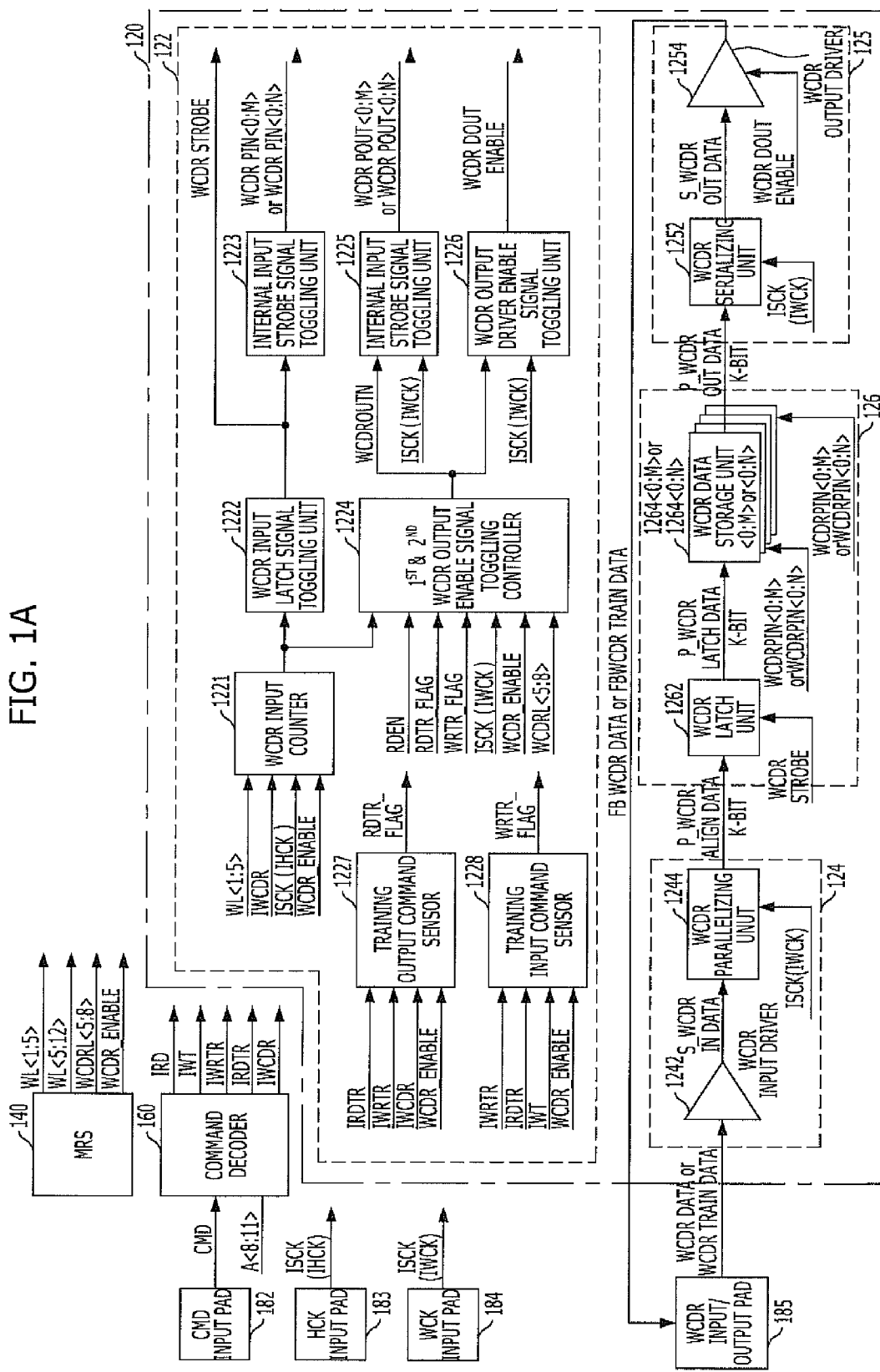
FIGS. 1A and 1B are block diagrams illustrating a semiconductor memory device in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

Figure 1B:
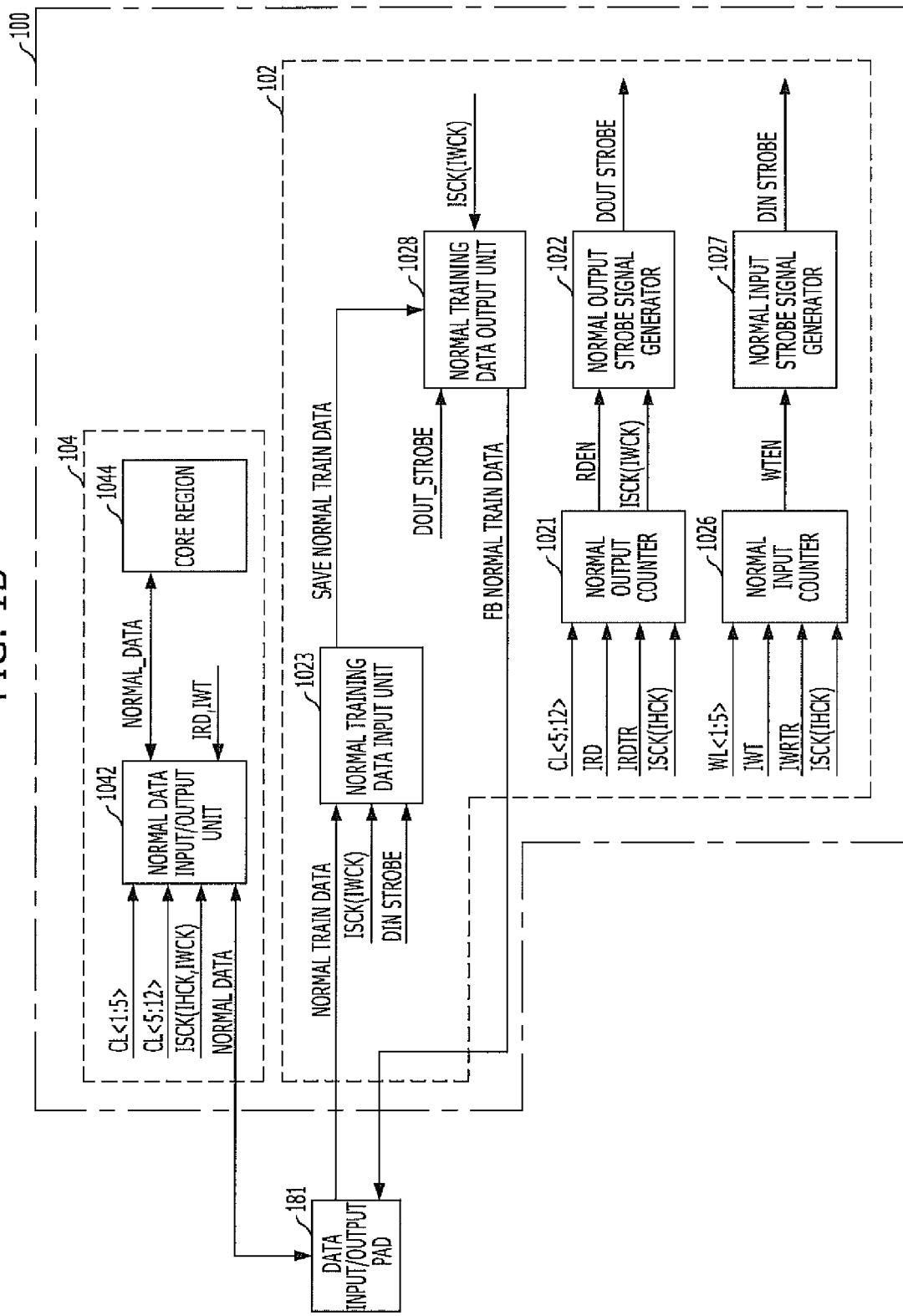

FIGS. 1A and 1B are block diagrams illustrating a semiconductor memory device in accordance with an exemplary embodiment of the present invention.

Referring to FIGS. 1A and 1B, the semiconductor memory device according to an exemplary embodiment of the present invention includes a first data input/output unit 100 and a second data input/output unit 120. The first data input/output unit 100 receives a normal training data NORMAL TRAIN DATA, whose data window is scanned based on an edge of a source clock ISCK, in response to a training input command IWRTR, and outputs a data FB NORMAL TRAIN DATA in a state where an edge of the data window is synchronized with an edge of the source clock ISCK in response to a training output command IRDTR. The second data input/output unit 120 receives a recovery information training data WCDR TRAIN DATA in a state where a data window is scanned based on the edge of the source clock ISCK in response to a training input command IWRTR, and outputs a data FB WCDR TRAIN DATA in a state where an edge of the data window is synchronized with the edge of the source clock ISCK in response to the training output command IRDTR.

Herein, the first data input/output unit 100 includes a block 104, which receives a normal data NORMAL DATA, whose center of a data window is synchronized with the edge of the source clock ISCK, in response to a write command IWT, and outputs a data NORMAL DATA in a state where the edge of the data window is synchronized with the edge of the source clock ISCK in response to a read command IRD along with a block 102, which receives a normal training data NORMAL TRAIN DATA, whose data window is scanned based on an edge of a source clock ISCK, in response to a training input command IWRTR, and outputs a data FB NORMAL TRAIN DATA in a state where the edge of the data window is synchronized with the edge of the source clock ISCK in response to a training output command IRDTR.

The second data input/output unit 120 includes a structure which receives a recovery information data WCDR DATA whose edge of a data window is synchronized with the edge of the source clock ISCK in response to a predetermined command IWCDR, which is not the training input command IWRTR or the training output command IRDTR, and outputs a data FB WCDR DATA whose edge of a data window is synchronized with the edge of the source clock ISCK after a certain time.

The semiconductor memory device according to the exemplary embodiment of the present invention further includes a command input pad 182, a normal data input/output pad 181, a recovery information (WCDR) data input/output pad 185, and clock input pads 183 and 184. The command input pad 182 receives a training input command IWRTR, a training output command IRDTR, and a predetermined command IWCDR. The normal data input/output pad 181 inputs/outputs normal data NORMAL DATA and FB NORMAL DATA and normal training data NORMAL TRAIN DATA and FB NORMAL TRAIN DATA. The WCDR data input/output pad 185 inputs/outputs recovery data WCDR DATA and FB WCDR DATA and recovery information training data WCDR DATA and FB WCDR DATA. The clock input pads 183 and 184 receive source clocks ISCK(IHCK) and ISCK(IWCK).

Herein, the second data input/output unit 120 performs an operation of receiving and outputting a recovery information data WCDR DATA or a recovery information training data WCDR TRAIN DATA, when the semiconductor memory device enters a recovery information operation mode or a recovery information training operation mode.

Herein, entering the recovery information operation mode or a recovery information training operation mode signifies that a recovery information enable signal WCDR_ENABLE is enabled/disabled.

Also, the enable moment and disable moment of the recovery information enable signal WCDR_ENABLE and the length of an enabled duration are predetermined in a memory register setting (MRS) 140.

The predetermined command IWCDR includes a write command IWT and a read command IRD. Also, the predetermined command IWCDR may further include diverse operation mode commands for a semiconductor memory device, other than the write command IWT and the read command IRD. In particular, a predetermined command IWCDR may include an auto-refresh operation mode entering command, which is one of the operation modes that uses the most power in a semiconductor memory device, or conversely include a stand-by operation mode entering command, which is one of the operation modes that uses the least power in a semiconductor memory device.

The reason why the predetermined command IWCDR can include the write command IWT, the read command IRD, and other diverse operation mode commands for a semiconductor memory device is that a command decoder 160 is designed to toggle the predetermined command IWCDR when the write command IWT, the read command IRD, and other diverse operation mode commands for a semiconductor memory device are toggled in a case where the recovery information enable signal WCDR_ENABLE is enabled and the semiconductor memory device enters the recovery information operation mode or the recovery information training operation mode.

Also, the time elapsing from a moment when the training input command IWRTR is inputted into the command input pad 182 to a moment when the normal training data NORMAL TRAIN DATA is inputted into the normal data input/output pad 181 is the same as the time elapsing from a moment when the training input command IWRTR is inputted into the command input pad 182 to a moment when the recovery information training data WCDR TRAIN DATA is inputted into the recovery information data input/output pad 185.

Also, because the time elapsing from a moment when the training output command IRDTR is inputted into the command input pad 182 to a moment when the normal training data FB NORMAL TRAIN DATA is outputted through the normal data input/output pad 181 and the time elapsing from a moment when the training output command IRDTR is inputted into the command input pad 182 to a moment when the recovery information training data FB WCDR TRAIN DATA is outputted through the recovery information data input/output pad 185 are determined based on a write latency WL, which is a value set up in the memory register setting (MRS) 140 of the semiconductor memory device, the two are the same.

Likewise, the time elapsing from a moment when the write command IWT is inputted into the command input pad 182 to a moment when a normal data NORMAL DATA is inputted into the normal data input/output pad 181; the time elapsing from a moment when the predetermined command IWCDR is inputted into the command input pad 182 to a moment when the recovery information data WCDR DATA is inputted into the recovery information data input/output pad 185; the time elapsing from a moment when the training input command IWRTR is inputted into the command input pad 182 to a moment when the normal training data NORMAL TRAIN DATA is inputted into the normal data input/output pad 181; and the time elapsing from a moment when the training input command IWRTR is inputted into the command input pad 182 to a moment when the recovery information training data WCDR TRAIN DATA is inputted into the recovery information data input/output pad 185 are determined based on the write latency WL, which is a value set up in the memory register setting (MRS) 140 of the semiconductor memory device. Thus, they are the same.

Also, the time elapsing from a moment when the read command IRD is inputted into the command input pad 182 to a moment when the normal data NORMAL DATA is outputted through the normal data input/output pad 181; and the time elapsing from a moment when the training output command IRDTR is inputted into the command input pad 182 to a moment when the normal training data NORMAL TRAIN DATA and the recovery information training data WCDR TRAIN DATA are outputted through the normal data input/output pad 181 and the recovery information data input/output pad 185 are also determined based on a column latency CL, which is a value set up in the memory register setting (MRS) 140 of the semiconductor memory device. Thus, they are the same. On the other hand, the time elapsing from a moment when the predetermined command IWCDR is inputted into the command input pad 182 to a moment when the recovery information data WCDR DATA is outputted through the recovery information data input/output pad 185 is determined based on a recovery information latency WCDR, which is a value set up in the memory register setting (MRS) 140 of the semiconductor memory device. Thus, it is not the same.

Herein, the write latency WL and the column latency CL, which are values set up in the memory register setting (MRS) 140, may be general specifications that are included in semiconductor memory devices. On the other hand, the recovery information latency WCDRL is a value independently set up in the memory register setting (MRS) 140 for the exemplary embodiment of the present invention.

The second data input/output unit 120 includes a recovery information data input/output controller 122, recovery information data input/output units 124 and 125, and a recovery information storage 126. The recovery information input/output controller 122 generates a first internal input strobe signal WCDR PIN<0:M> corresponding to an internal input moment of the recovery information training data WCDR TRAIN DATA in response to the training input command IWRTR, and generates a first internal output strobe signal WCDR POUT<0:M> corresponding to an internal output moment of the recovery information training data WCDR TRAIN DATA in response to the training output command IRDTR. The recovery information data input/output units 124 and 125 input/output recovery information training data WCDR TRAIN DATA and FB WCDR TRAIN DATA through the recovery information data input/output pad 185. The recovery information storage 126 stores the recovery information training data WCDR TRAIN DATA for a certain time in response to the first internal input strobe signal WCDR PIN<0:M> and the first internal output strobe signal WCDR POUT<0:M>.

Herein, the recovery information input/output controller 122 may include a constituent element that generates a second internal input strobe signal WCDR PIN<0:N> corresponding to an internal input moment of the recovery information data WCDR DATA and generates a second internal output strobe signal WCDR POUT<0:N> corresponding to an internal output moment of the recovery information data WCDR DATA in response to the predetermined command IWCDR.

Also, the recovery information data input/output units 124 and 125 include a constituent element that inputs/outputs recovery information data WCDR DATA and FB WCDR DATA through the recovery information data input/output pad 185.

Also, the recovery information storage 126 includes a constituent element that stores the recovery information data WCDR DATA for a predetermined time in response to the second internal input strobe signal WCDR PIN<0:N> and the second internal output strobe signal WCDR POUT<0:N>.

Hereafter, the structure of the recovery information input/output controller 122 will be described in detail. The recovery information input/output controller 122 includes a recovery information input control block 1221, 1222, 1223 and 1228 and a recovery information output control block 1224, 1225, 1226 and 1227. The recovery information input control block 1221, 1222, 1223 and 1228 toggles the first internal input strobe signal WCDR PIN<0:M> or the second internal input strobe signal WCDR PIN<0:N> at a moment after a time period, during which the period (TCK) of a source clock repeats a first number of times, elapses from a moment when the training input command IWRTR or the predetermined command IWCDR is inputted. The recovery information output control block 1224, 1225, 1226 and 1227 toggles the first internal output strobe signal WCDR POUT<0:M> at a moment after a time period, during which the period (TCK) of the source clock ISCK repeats a second number of times, elapses from a moment when the training output command IRDTR is inputted, and toggles the second internal output strobe signal WCDR POUT<0:N> at a moment after a time period, during which the period (TCK) of the source clock ISCK repeats a third number of times, elapses from a moment when the second internal input strobe signal WCDR PIN<0:N> is toggled.

Herein, the recovery information input control block 1221, 1222, 1223 and 1228 includes a recovery information input counter 1221 and an input strobe signal generation portion 1222 and 1223. The recovery information input counter 1221 counts the period of the source clock ISCK until it reaches the first number of times from a moment when the training input command IWRTR or the predetermined command IWCDR is inputted, and toggles a recovery information input enable signal WCDRINEN in response to the completion of the counting. The input strobe signal generation portion 1222 and 1223 generates the first internal input strobe signal WCDR PIN<0:M> in response to the toggling of the recovery information input enable signal WCDRINEN when the training input command IWRTR is inputted into the command input pad 182, and generates the second internal input strobe signal WCDR PIN<0:N> in response to the recovery information input enable signal WCDRINEN when the predetermined command IWCDR is inputted into the command input pad 182. The recovery information input control block 1221, 1222, 1223 and 1228 further includes a training input command sensor 1228 which enables a training input command sense signal WRTR_FLAG in response to an input of the training input command IWRTR, and disables the training input command sense signal WRTR_FLAG in response to an input of the training output command IRDTR.

The recovery information output control block 1224, 1225, 1226 and 1227 includes a first recovery information output enable signal toggling controller 1224, a second recovery information output enable signal toggling controller 1224, and an output strobe signal generation portion 1225 and 1226. The first recovery information output enable signal toggling controller 1224 toggles a recovery information output enable signal WCDROUTEN in response to a normal output enable signal RDEN which is toggled at a moment after a time period, during which a number of periods of the source clock ISCK counted is the second number of times, elapses from an input moment when the training output command IRDTR is inputted into the command input pad 182. The second recovery information output enable signal toggling controller 1224 counts the third number of times that the period of the source clock ISCK repeats in response to a toggling of the recovery information input enable signal WCDRINEN when the predetermined command IWCDR is inputted into the command input pad 182, and toggles the recovery information output enable signal WCDROUTEN in response to the completion of the counting. The output strobe signal generation portion 1225 and 1226 generates the first internal output strobe signal WCDR POUT<0:M> in response to a toggling of the recovery information output enable signal WCDROUTEN, when the training output command IRDTR is inputted into the command input pad 182, and generates the second internal output strobe signal WCDR POUT<0:N> in response to a toggling of the recovery information output enable signal WCDROUTEN, when the predetermined command IWCDR is inputted into the command input pad 182. The recovery information output control block 1224, 1225, 1226 and 1227 further includes a training output command sensor 1227, which enables a write training output command sense signal RDTR_FLAG in response to an input of the training output command IRDTR, and disables the training output command sense signal RDTR_FLAG in response to an input of the training input command IWRTR.

Herein, it may be seen that the first internal input strobe signal WCDR PIN<0:M> and the second internal input strobe signal WCDR PIN<0:N> are different from each other in that the number of signals included is M and N, respectively, and the first internal output strobe signal WCDR POUT<0:M> and the second internal output strobe signal WCDR POUT<0:N> are different from each other in that the number of signals included is M and N, respectively. The names of the signals are distinguished from each other because their toggling timing is different according to an operation. The operations will be described in more detail later.

Among the constituent elements of the recovery information output control block 1224, 1225, 1226 and 1227, the first recovery information output enable signal toggling controller 1224 and the second recovery information output enable signal toggling controller 1224 indicate the same constituent element. This is because the first recovery information output enable signal toggling controller 1224 and the second recovery information output enable signal toggling controller 1224 perform different operations according to whether an input signal is enabled or disabled. The structures will be described in more detail later, too.

The input strobe signal generation portion 1222 and 1223 includes a recovery information input latch signal toggling unit 1222 and an internal input strobe signal toggling unit 1223. The recovery information input latch signal toggling unit 1222 toggles a recovery information input latch signal WCDR STROBE with a predetermined time difference in response to a toggling of the recovery information input enable signal WCDRINEN. The internal input strobe signal toggling unit 1223 toggles the first internal input strobe signal WCDR PIN<0:M> in response to a toggling of the recovery information input latch signal WCDR STROBE when the training input command IWRTR is inputted, and toggles the second internal input strobe signal WCDR PIN<0:N> in response to a toggling of the recovery information input latch signal WCDR STROBE when the predetermined command IWCDR is inputted.

Herein, regardless of whether the training input command IWRTR is inputted or the predetermined command IWCDR is inputted, if a command is inputted once and the recovery information input enable signal WCDRINEN is toggled once and accordingly the recovery information input latch signal WCDR STROBE is toggled only one time, any one signal predetermined among a plurality of signals included in the first internal input strobe signal WCDR PIN<0:M> (which is a signal WCDR PIN<0> in most cases because the first internal input strobe signal WCDR PIN<0:M> begins to engage in the operation from the least significant bit (LSB)) is toggled; and any one signal predetermined among a plurality of signals included in the second internal input strobe signal WCDR PIN<0:N> (which is a signal WCDR PIN<0> in most cases because the second internal input strobe signal WCDR PIN<0:N> begins to engage in the operation from the least significant bit (LSB)) is toggled. Therefore, when a command is inputted only once as described above, the first internal input strobe signal WCDR PIN<0:M> and the second internal input strobe signal WCDR PIN<0:N> are substantially the same signal.

However, when the training input command IWRTR or the predetermined command IWCDR is consecutively inputted and the recovery information input enable signal WCDRINEN is consecutively toggled, the recovery information input latch signal toggling unit 1222 among the constituent elements of the input strobe signal generation portion 1222 and 1223 consecutively toggles the recovery information input latch signal WCDR STROBE in response to the consecutive toggling of the recovery information input enable signal WCDRINEN with a certain time difference.

Likewise, the internal input strobe signal toggling unit 1223 of the input strobe signal generation portion 1222 and 1223 sequentially toggles a plurality of signals included in the first internal input strobe signal WCDR PIN<0:M> (WCDR PIN<0>→WCDR PIN<1>→WCDR PIN<2>→ . . . → WCDR PIN<M-1>→WCDR PIN<M>) in response to the consecutive input of the training input command IWRTR and the consecutive toggling of the recovery information input latch signal WCDR STROBE performed thereafter; and sequentially toggles a plurality of signals included in the second internal input strobe signal WCDR PIN<0:N> (WCDR PIN<0>→WCDR PIN<1>→WCDR PIN<2>→ . . . →WCDR PIN<N-1>→WCDR PIN<N>) in response to the consecutive input of the predetermined command IWCDR and the consecutive toggling of the recovery information input latch signal WCDR STROBE performed thereafter.

Therefore, in the above-described case where a command is consecutively inputted, the first internal input strobe signal WCDR PIN<0:M> and the second internal input strobe signal WCDR PIN<0:N> may be substantially different signals from each other.

The output strobe signal generation portion 1225 and 1226 includes a recovery information output driver enable signal toggling unit 1226 and an internal output strobe signal toggling unit 1225. The recovery information output driver enable signal toggling unit 1226 consecutively toggles the recovery information output driver enable signal WCDR DOUT ENABLE as many times as a number corresponding to a bit number of the recovery information data WCDR DATA or the recovery information training data WCDR TRAIN DATA in response to a toggling of the recovery information output enable signal WCDROUTEN. The internal output strobe signal toggling unit 1225 toggles the first internal output strobe signal WCDR POUT<0:M> in response to a toggling of the recovery information output enable signal WCDROUTEN when the training output command IRDTR is inputted; and toggles the second internal output strobe signal WCDR POUT<0:N> in response to a toggling of the recovery information output enable signal WCDROUTEN when the predetermined command IWCDR is inputted.

Herein, regardless of whether the training output command IRDTR is inputted or the predetermined command IWCDR is inputted, if a command is inputted once and the recovery information output enable signal WCDROUTEN is toggled once, any one predetermined signal from among a plurality of signals included in the first internal output strobe signal WCDR POUT<0:M> (which is a signal WCDR POUT<0> in most cases because the first internal output strobe signal WCDR POUT<0:M> begins to engage in the operation begins from the least significant bit (LSB)) is toggled; and any one predetermined signal from among a plurality of signals included in the second internal output strobe signal WCDR POUT<0:N> (which is a signal WCDR POUT<0> in most cases because the second internal output strobe signal WCDR POUT<0:N> begins to engage in the operation begins from the least significant bit (LSB)) is toggled. Therefore, when a command is inputted only once as described above, the first internal output strobe signal WCDR POUT<0:M> and the second internal output strobe signal WCDR POUT<0:N> are substantially the same signal.

However, when the training output command IRDTR or the predetermined command IWCDR is consecutively inputted and the recovery information output enable signal WCDRINEN is consecutively toggled, the recovery information output driver enable signal toggling unit 1226 of the output strobe signal generation portion 1225 and 1226 consecutively toggles the recovery information output driver enable signal WCDR DOUT ENABLE as many times as a number corresponding to a bit number of the recovery information data WCDR DATA or the recovery information training data WCDR TRAIN DATA whenever the recovery information output enable signal WCDROUTEN is consecutively toggled.

Likewise, the internal output strobe signal toggling unit 1225 of the output strobe signal generation portion 1225 and 1226 sequentially toggles a plurality of signals included in the first internal output strobe signal WCDR P OUT <0:M> (WCDR POUT<0>→WCDR POUT<1>→WCDR POUT<2>→ . . . →WCDR POUT<M-1>→WCDR POUT<M>) in response to the consecutive input of training output command IRDTR and the consecutive toggling of the recovery information output enable signal WCDROUTEN performed thereafter; and sequentially toggles a plurality of signals included in the second internal output strobe signal WCDR POUT <0:N> (WCDR POUT <0>→>WCDR POUT <1>→WCDR POUT <2>→ . . . →WCDR POUT <N−1>→WCDR POUT <N>) in response to the consecutive input of the predetermined command IWCDR and the consecutive toggling of the recovery information output enable signal WCDROUTEN performed thereafter.

Therefore, in the above-described case where a command is consecutively inputted, the first internal output strobe signal WCDR POUT <0:M> and the second internal output strobe signal WCDR POUT <0:N> may be substantially different signals from each other.

The recovery information data input/output units 124 and 125 include a recovery information data input unit 124 and a recovery information data output unit 125. The recovery information data input unit 124 buffers a signal S_WCDR IN DATA which corresponds to the recovery information data WCDR DATA or the recovery information training data WCDR TRAIN DATA to which a plurality of bits are serially applied through the recovery information data input/output pad 185, synchronizes it with the source clock ISCK for parallelization, and outputs it as a signal P_WCDR ALIGN DATA. The recovery information data output unit 125 synchronizes a signal P_WCDR OUT DATA, which corresponds to the recovery information data WCDR DATA or the recovery information training data WCDR TRAIN DATA provided in a parallelized state through the recovery information storage 126, with the source clock ISCK for serialization, and outputs a serialized signal as a signal S_WCDR OUT DATA; and outputs a feedback recovery information data FB WCDR DATA or a feedback recovery information training data FB WCDR TRAIN DATA through the recovery information data input/output pad 185 in response to a toggling of the recovery information output driver enable signal WCDR DOUT ENABLE.

The recovery information data input unit 124 of the recovery information data input/output units 124 and 125 includes a recovery information data input driver 1242 and a recovery information data parallelize unit 1244.

The recovery information data input driver 1242 sequentially buffers recovery information data WCDR DATA, or recovery information training data WCDR TRAIN DATA, of which a plurality of consecutive bits are serially applied through the recovery information data input/output pad 185.

The recovery information data parallelize unit 1244 sequentially parallelizes the buffered data in synchronization with the source clock ISCK.

Herein, when the training output command IRDTR or the predetermined command IWCDR are consecutively inputted and the recovery information output enable signal WCDROUTEN is consecutively toggled, the recovery information data input unit 124 sequentially buffers signals S_WCDR IN DATA0, S_WCDR IN DATA1, . . . , S_WCDR IN DATAM or S_WCDR IN DATA0, S_WCDR IN DATA1, . . . , S_WCDR IN DATAN, which correspond to a plurality of recovery information data WCDR DATA0, WCDR DATA1, . . . , WCDR DATAM or WCDR DATA0, WCDR DATA1, . . . , WCDR DATAN, or a plurality of recovery information training data WCDR TRAIN DATA0, WCDR TRAIN DATA1, . . . , WCDR TRAIN DATAM or WCDR TRAIN DATA0, WCDR TRAIN DATA1, . . . , WCDR TRAIN DATAN, to which a plurality of consecutive bits are serially applied through the recovery information data input/output pad 185; sequentially parallelizes them in synchronization with the source clock ISCK; and outputs them as signals P_WCDR ALIGN DATA0, P_WCDR ALIGN DATA1, . . . , P_WCDR ALIGN DATAM or P_WCDR ALIGN DATA0, P_WCDR ALIGN DATA1, . . . , P_WCDR ALIGN DATAN.

Likewise, when the training input command IWRTR or the predetermined command IWCDR are consecutively inputted and the recovery information output enable signal WCDROUTEN is consecutively toggled, the recovery information data output unit 125 sequentially serializes in synchronization with the source clock ISCK signals P_WCDR ALIGN DATA0, P_WCDR ALIGN DATA1, . . . , P_WCDR ALIGN DATAM or P_WCDR ALIGN DATA0, P_WCDR ALIGN DATA1, . . . , P_WCDR ALIGN DATAN, which correspond to a plurality of parallelized recovery information data WCDR DATA0, WCDR DATA1, . . . , WCDR DATAM or WCDR DATA0, WCDR DATA1, . . . , WCDR DATAN, or a plurality of recovery information training data WCDR TRAIN DATA0, WCDR TRAIN DATA1, . . . , WCDR TRAIN DATAM or WCDR TRAIN DATA0, WCDR TRAIN DATA1, . . . , WCDR TRAIN DATAN that are sequentially provided through the recovery information storage 126; and outputs them as signals S_WCDR ALIGN DATA0, S_WCDR ALIGN DATA1, . . . , S_WCDR ALIGN DATAM or S_WCDR ALIGN DATA0, S_WCDR ALIGN DATA1, . . . , S_WCDR ALIGN DATAN; and in response to the recovery information output driver enable signal WCDR DOUT ENABLE, outputs them as a plurality of feedback recovery information data FB WCDR DATA0, FB WCDR DATA1, . . . , FB WCDR DATAM or FB WCDR DATA0, FB WCDR DATA1, . . . , FB WCDR DATAN, or a plurality of feedback recovery information training data FB WCDR TRAIN DATA0, FB WCDR TRAIN DATA1, . . . , FB WCDR TRAIN DATAM or FB WCDR TRAIN DATA0, FB WCDR TRAIN DATA1, . . . , FB WCDR TRAIN DATAN.

Further, the recovery information storage 126 includes a recovery information latch unit 1262 and a recovery information data storage unit 1264<0:M> or 1264<0:N>. The recovery information latch unit 1262 latches a signal P_WCDR ALIGN DATA corresponding to the recovery information data WCDR DATA or the recovery information training data WCDR TRAIN DATA, which is parallelized through the recovery information data input unit 124, in parallel in response to a toggling of the recovery information input latch signal WCDR STROBE. The recovery information data storage unit 1264<0:M> or 1264<0:N> stores a data P_WCDR LATCH DATA obtained from the parallel latching through the recovery information latch unit 1262 in response to the first internal input strobe signal WCDR PIN<0:M> or the second internal input strobe signal WCDR PIN<0:N>, and provides the stored data as a data P_WCDR OUT DATA to the recovery information data output unit 125 in response to the first internal output strobe signal WCDR POUT<0:M> or the second internal output strobe signal WCDR POUT<0:N>.

Herein, regardless of whether the training output command IRDTR is inputted or the predetermined command IWCDR is inputted, when the data P_WCDR ALIGN DATA corresponding to the recovery information data WCDR DATA or the recovery information training data WCDR TRAIN DATA, which is parallelized based on a one-time input of a command, is inputted only once, a parallel latching operation and an operation of storing the parallel-latched data P_WCDR LATCH DATA are performed once in the recovery information latch unit 1262 and the recovery information data storage unit 1264<0:M> or 1264<0:N>, respectively. Accordingly, the recovery information data storage unit 1264<0:M> or 1264<0:N> needs a space for storing one parallel-latched data P_WCDR LATCH DATA. Therefore, one predetermined storage space from among a plurality of storage spaces included in the recovery information data storage unit 1264<0:M> or 1264<0:N> (which is a space 1264<0> in most cases because it begins from the least significant bit (LSB), is used.

However, when the data P_WCDR ALIGN DATA corresponding to the recovery information data WCDR DATA or the recovery information training data WCDR TRAIN DATA obtained as the training output command IRDTR or the predetermined command IWCDR is consecutively inputted and parallelized a plurality of times, the recovery information latch unit 1262 of the recovery information storage 126 sequentially latches data P_WCDR ALIGN DATA0, P_WCDR ALIGN DATA1, . . . , P_WCDR ALIGN DATAM or P_WCDR ALIGN DATA0, P_WCDR ALIGN DATA1, . . . , P_WCDR ALIGN DATAN, which correspond to a plurality of recovery information data WCDR DATA0, WCDR DATA1, . . . , WCDR DATAM or WCDR DATA0, WCDR DATA1, . . . , WCDR DATAN, or the recovery information training data WCDR TRAIN DATA0, WCDR TRAIN DATA1, . . . , WCDR TRAIN DATAM or WCDR TRAIN DATA0, WCDR TRAIN DATA1, . . . , WCDR TRAIN DATAN, in response to consecutive toggling of the recovery information input latch signal WCDR STROBE.

Likewise, the recovery information data storage unit 1264<0:M> or 1264<0:N> of the recovery information storage 126 sequentially stores data P_WCDR LATCH DATA0, P_WCDR LATCH DATA1, . . . , P_WCDR LATCH DATAM or P_WCDR LATCH DATA0, P_WCDR LATCH DATA1, . . . , P_WCDR LATCH DATAN, which are sequentially outputted after being latched in parallel through the recovery information latch unit 1262 in response to the sequential toggling of a plurality of signals included in the first internal output strobe signal WCDR PIN<0:M> or the second internal output strobe signal WCDR PIN<0:N> (WCDR PIN<0>→WCDR PIN<1>→WCDR PIN<2>→ . . . →WCDR PIN<M-1>→WCDR PIN<M> or WCDR PIN<0>→WCDR PIN<1>→WCDR PIN<2>→ . . . →WCDR PIN<N-1>→WCDR PIN<N>), and sequentially provides the stored data to the recovery information data output unit 125 in response to the sequential toggling of a plurality of signals included in the first internal output strobe signal WCDR POUT<0:M> or the second internal output strobe signal WCDR POUT<0:N> (WCDR POUT<0>→WCDR POUT<1>→WCDR POUT<2>→ . . . →WCDR POUT<M-1>→WCDR POUT<M> or WCDR OUTP<0>→WCDR POUT<1>→WCDR POUT<2>→ . . . →WCDR POUT<N-1>→WCDR POUT<N>).

When a command is consecutively inputted a plurality of times, which is described above, a parallel latch operation and an operation of storing parallel-latched data P_WCDR LATCH DATA0, P_WCDR LATCH DATA1, . . . , P_WCDR LATCH DATAM or P_WCDR LATCH DATA0, P_WCDR LATCH DATA1, . . . , P_WCDR LATCH DATAN are performed a plurality of times in the recovery information latch unit 1262 and the recovery information data storage unit 1264<0:M> or 1264<0:N>, respectively. Therefore, the recovery information data storage unit 1264<0:M> or 1264<0:N> needs a plurality of storage spaces for respectively storing M or N parallel-latched data P_WCDR LATCH DATA0, P_WCDR LATCH DATA1, . . . , P_WCDR LATCH DATAM or P_WCDR LATCH DATA0, P_WCDR LATCH DATA1, . . . , P_WCDR LATCH DATAN.

In the first data input/output unit 100, a constituent element 102, for receiving a normal training data NORMAL TRAIN DATA (whose data window is scanned based on the edge of the source clock ISCK) in response to the training input command IWRTR and outputting a signal FB NORMAL TRAIN DATA in such a manner that the edge of the data window is synchronized with the edge of the source clock ISCK in response to the training output command IRDTR, has the following structure.

First, the constituent element 102 of the first data input/output unit 100 includes a normal input control block 1026, 1023 and 1027, and a normal output control block 1028, 1021 and 1022. The normal input control block 1026, 1023 and 1027 receives and stores the normal training data NORMAL TRAIN DATA at a moment after a time, during which the period (TCK) of the source clock ISCK is repeated the first number of times, elapses from a moment when the training input command IWRTR is inputted. The normal output control block 1028, 1021 and 1022 outputs the normal training data NORMAL TRAIN DATA stored through the normal input control block 1026, 1023 and 1027 at a moment after a time, during which the period (TCK) of the source clock ISCK is repeated the second number of times, elapses from a moment when the training output command IRDTR is inputted.

Herein, the normal input control block 1026, 1023 and 1027 includes a normal input counter 1026, a normal input strobe signal generator 1027, and a normal training data input unit 1023. The normal input counter 1026 counts the period (TCK) of the source clock ISCK as many as the first number of times from a moment when the training input command IWRTR is inputted and toggles a normal input enable signal WTEN in response to the completion of the counting. The normal input strobe signal generator 1027 generates a normal input strobe signal DIN STROBE in response to a toggling of the normal input enable signal WTEN. The normal training data input unit 1023 receives the normal training data NORMAL TRAIN DATA through the normal data input/output pad 181 and stores it in a predetermined register (which is not directly shown in the drawings but may be mounted inside the normal training data input unit 1023) in response to the normal input strobe signal DIN STROBE.

Also, the normal output control block 1028, 1021 and 1022 includes a normal output counter 1021, a normal output strobe signal generator 1022, and a normal training data output unit 1028. The normal output counter 1021 counts the period of the source clock ISCK as many as the second number of times (TCK) from a moment when the training input command IWRTR is inputted and toggles the normal output enable signal RDEN in response to the completion of the counting. The normal output strobe signal generator 1022 generates a normal output strobe signal DOUT STROBE in response to the toggling of the normal output enable signal RDEN. The normal training data output unit 1028 outputs the normal training data NORMAL TRAIN DATA stored in the predetermined register (which is not directly shown in the drawings but may be mounted inside the normal training data input unit 1023) as a feedback normal training data FB NORMAL TRAIN DATA through the normal data input/output pad 181 in response to the normal output strobe signal DOUT STROBE.

In the above-described structure of the semiconductor memory device according to the embodiment of the present invention, the source clock ISCK may include a system clock IHCK for synchronizing the training input command IWRTR, the training output command IRDTR, and the predetermined command IWCDR that are inputted through the command input pad 182 according to the kind of semiconductor memory device to which the exemplary embodiment of the present invention is applied; and a data clock IWCK for synchronizing the normal data NORMAL DATA, the normal training data NORMAL TRAIN DATA and FB NORMAL TRAIN DATA, the recovery information WCDR DATA and FB WCDR DATA, and the recovery information training data WCDR TRAIN DATA and FB WCDR TRAIN DATA that are inputted/outputted through the normal data input/output pad 181 and the recovery information data input/output pad 185.

When the source clock ISCK is divided into the system clock IHCK and the data clock IWCK, the recovery information input/output controller 122 according to the above-described exemplary embodiment of the present invention may have the following structure.

The recovery information input/output controller 122 includes a recovery information input control block 1221, 1222, 1223 and 1228 and a recovery information output control block 1224, 1225, 1226 and 1227. The recovery information input control block 1221, 1222, 1223 and 1228 toggles the first internal input strobe signal WCDR PIN<0:M> and the second internal input strobe signal WCDR PIN<0:N> at a moment after a time, during which the period (TCK) of the system clock IHCK is repeated the first number of times, elapses from a moment when the training input command IWRTR or the predetermined command IWCDR is inputted. The recovery information output control block 1224, 1225, 1226 and 1227 toggles the first internal output strobe signal WCDR POUT<0:M> at a moment after a time, during which the period (TCK) of the source clock ISCK is repeated the second number of times, elapses from a moment when the training output command IRDTR is inputted, and toggles the second internal output strobe signal WCDR POUT<0:N> at a moment after a time, during which the period (TCK) of the source clock ISCK is repeated the third number of times, elapses from a moment when the first internal input strobe signal WCDR PIN<0:M> and the second internal input strobe signal WCDR PIN<0:N> is toggled.

As described above, although the source clock ISCK is divided into the system clock IHCK and the data clock IWCK, the structure of the semiconductor memory device according to one exemplary embodiment of the present invention is not directly changed and if there is any difference, the data clock IWCK is used for the operation of the constituent elements for inputting/outputting a data and the system clock IHCK is used for the operation of the constituent element for inputting a command.

Figure 2A:
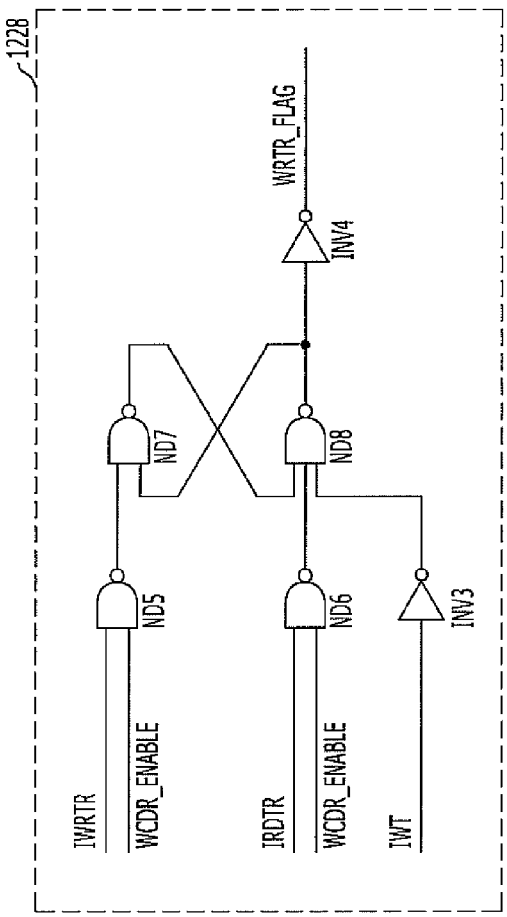
FIG. 2A is a circuit diagram illustrating a training input command sensor of the semiconductor memory device shown in FIGS. 1A and 1B.
Figure 2B:
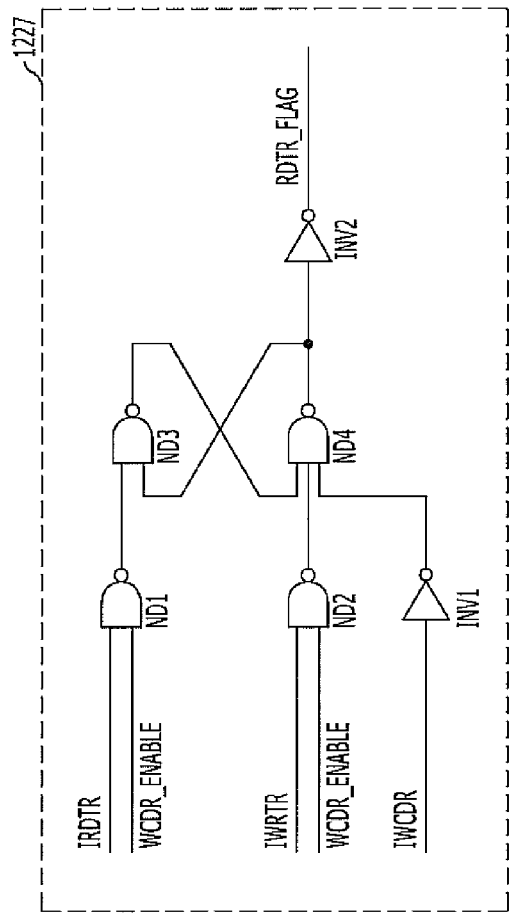
FIG. 2B is a circuit diagram illustrating a training output command sensor of the semiconductor memory device shown in FIGS. 1A and 1B.

FIG. 2A is a circuit diagram illustrating a training input command sensor of the semiconductor memory device shown in FIGS. 1A and 1B. FIG. 2B is a circuit diagram illustrating a training output command sensor of the semiconductor memory device shown in FIGS. 1A and 1B.

Referring to FIGS. 2A and 2B, a training input command sensor 1228 of the semiconductor memory device includes a first NAND gate ND5 for performing a NAND operation onto the training input command IWRTR and the recovery information enable signal WCDR_ENABLE, a second NAND gate ND6 for performing a NAND operation onto the training output command IRDTR and the recovery information enable signal WCDR_ENABLE, a first inverter INV3 for inverting the phase of the write command IWT, and a set-reset (SR) latch ND7, ND8 and INV4. The set-reset (SR) latch ND7, ND8 and INV4 receives an output signal of the first NAND gate ND5 through a set input terminal, receives an output signal of the second NAND gate ND6 and an output signal of the first inverter INV3 through a reset input terminal, inverts the phase of a signal applied to an auxiliary output terminal, and outputs a training input command sense signal WRTR_FLAG.

In other words, the training input command sensor 1228 of the semiconductor memory device enables the training input command sense signal WRTR_FLAG to a logic high level and outputs it in response to the training input command IWRTR enabled to a logic high level while the recovery information enable signal WCDR_ENABLE is enabled to a logic high level and the write command IWT and the training output command IRDTR are disabled to a logic low level.

Also, the training input command sensor 1228 disables the training input command sense signal WRTR_FLAG to a logic low level and outputs it in response to the training output command IRDTR enabled to a logic high level, regardless of the logic level of the training input command IWRTR, while the recovery information enable signal WCDR_ENABLE is enabled to a logic high level and the write command IWT is disabled to a logic low level.

Also, the training input command sensor 1228 disables the training input command sense signal WRTR_FLAG to a logic low level and outputs it regardless of the logic levels of the recovery information enable signal WCDR_ENABLE, the training input command IWRTR, and the training output command IRDTR in response to the write command IWT enabled to a logic high level.

The training output command sensor 1227 of the semiconductor device according to the embodiment of the present invention includes a first NAND gate ND1 for performing a NAND operation onto the training output command IRDTR and the recovery information enable signal WCDR_ENABLE, a second NAND gate ND2 for performing a NAND operation onto the training input command IWRTR and the recovery information enable signal WCDR_ENABLE, a first inverter INV1 for inverting the phase of the predetermined command IWCDR, and a set-reset (SR) latch ND3, ND4 and INV2. The set-reset (SR) latch ND3, ND4 and INV2 receives an output signal of the first NAND gate ND1 through a set input terminal, receives an output signal of the second NAND gate ND2 and an output signal of the first inverter INV1 through a reset input terminal, inverts the phase of a signal applied to an auxiliary output terminal, and outputs a training output command sense signal RDTR_FLAG.

In other words, the training output command sensor 1227 among the constituent elements of the semiconductor memory device enables the training output command sense signal RDTR_FLAG to a logic high level and outputs it in response to the training output command IRDTR enabled to a logic high level while the recovery information enable signal WCDR_ENABLE is enabled to a logic high level and the predetermined command IWCDR and the training input command IWRTR are disabled to a logic low level.

Also, the training output command sensor 1227 disables the training output command sense signal RDTR_FLAG to a logic low level and outputs it in response to the training output command IRDTR enabled to a logic high level, regardless of the logic level of the training output command IRDTR, while the recovery information enable signal WCDR_ENABLE is enabled to a logic high level and the training input command IWRTR is disabled to a logic low level.

Also, the training output command sensor 1227 disables the training output command sense signal RDTR_FLAG to a logic low level and outputs it regardless of the logic levels of the recovery information enable signal WCDR_ENABLE, the training input command IWRTR, and the training output command IRDTR in response to the predetermined command IWCDR enabled to a logic high level.

Figure 3A:
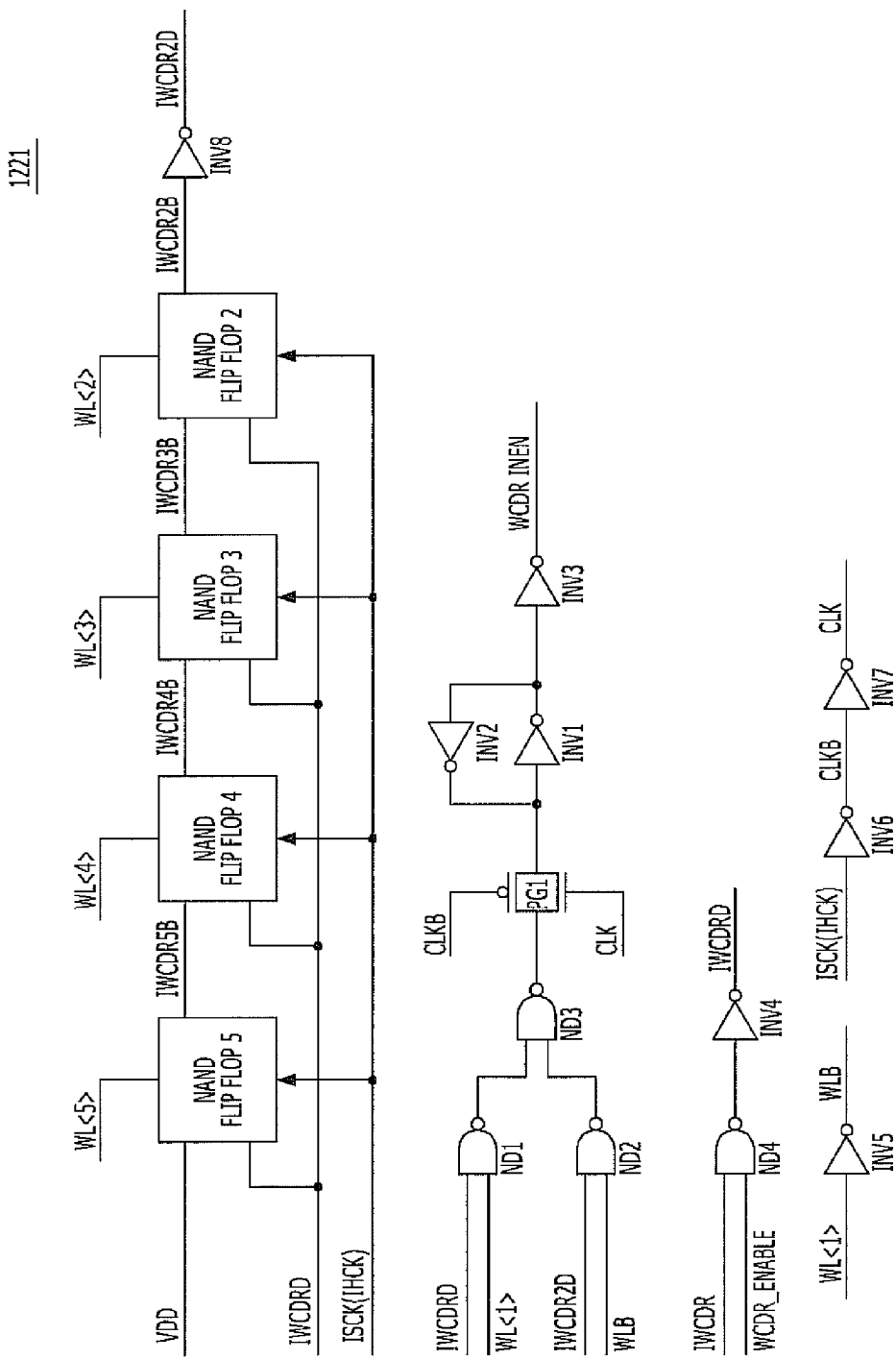
FIG. 3A is a circuit diagram illustrating a recovery information (WCDR) input counter of the semiconductor memory device shown in FIGS. 1A and 1B.

FIG. 3A is a circuit diagram illustrating a recovery information (WCDR) input counter of the semiconductor memory device shown in FIGS. 1A and 1B.

Figure 3B:
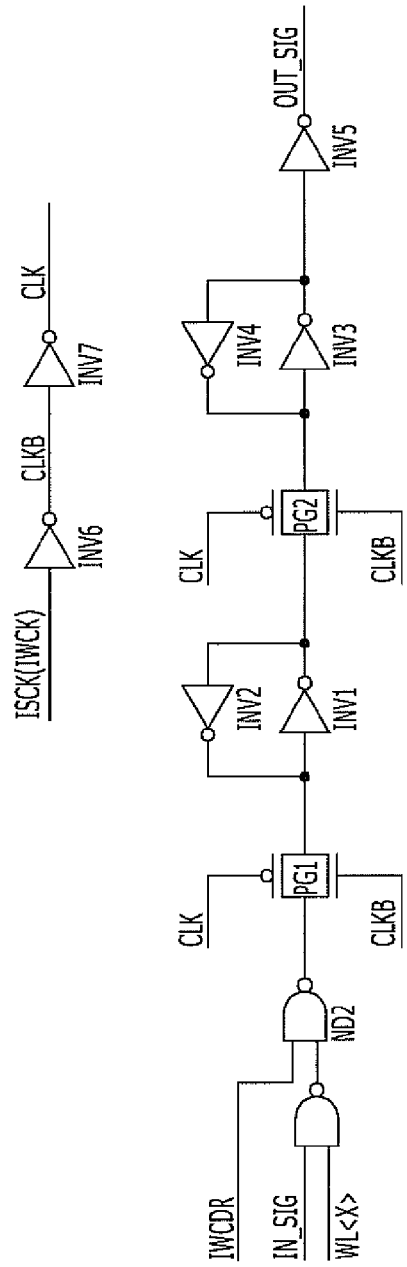
FIG. 3B is a circuit diagram illustrating a NAND flip flop of the recovery information input counter shown in FIG. 2.

FIG. 3B is a circuit diagram illustrating a NAND flip flop of the recovery information input counter shown in FIG. 2.

Referring to FIG. 3A, the recovery information input counter 1221 of the semiconductor memory device according to the exemplary embodiment of the present invention includes a first NAND gate ND4 and a first inverter INV4, a plurality of NAND flip flops NAND FLIP FLOP2, NAND FLIP FLOP3, NAND FLIP FLOP4, and NAND FLIP FLOP5, a second inverter INV8, a third inverter INV5, a second NAND gate ND1, a third NAND gate ND2, a forth NAND gate ND3, a pass gate PG1, and fourth to sixth inverters INV1, INV2 and INV3.

The first NAND gate ND4 and the first inverter INV4 performs an AND operation onto the predetermined command IWCDR and the recovery information enable signal WCDR_ENABLE and outputs a counting start control signal WCDRD. The plurality of NAND flip flops NAND FLIP FLOP2, NAND FLIP FLOP3, NAND FLIP FLOP4, and NAND FLIP FLOP5, which are connected in series to form a chain type structure, receives the source clock ISCK as a clock signal, receives any one signal among a plurality of signals WL<1>, WL<2>, WL<3>, WL<4>, and WL<5> for defining a first number of times, except the least signal WL<1>, and starts to perform an operation in response to the counting start control signal WCDRD. The second inverter INV8 inverts the phase of a signal IWCDR2B outputted from the rearmost NAND FLIP FLOP2 among the NAND flip flops NAND FLIP FLOP2, NAND FLIP FLOP3, NAND FLIP FLOP4, and NAND FLIP FLOP5 and outputs a signal IWCDR2D. The third inverter INV5 inverts the phase of the least signal WL<1> among the plurality of the signals WL<1>, WL<2>, WL<3>, WL<4>, and WL<5> and outputs a signal WLB. The second NAND gate ND1 performs a NAND operation onto the counting start control signal WCDRD and the least signal WL<1> among the plurality of the signals WL<1>, WL<2>, WL<3>, WL<4>, and WL<5>. The third NAND gate ND2 performs a NAND operation onto the output signal IWCDR2D of the second inverter INV8 and the output signal WLB of the third inverter INV5. The forth NAND gate ND3 performs a NAND operation onto an output signal of the second NAND gate ND1 and an output signal of the third NAND gate ND2. The pass gate PG1 synchronizes an output signal of the forth NAND gate ND3 with the source clock ISCK, which includes CLK and CLKB. The fourth to sixth inverters INV1, INV2 and INV3 latch an output signal outputted from the pass gate PG1 and outputs a recovery information input enable signal WCDRINEN. Also, the recovery information input counter 1221 further includes seventh and eighth inverters INV6 and INV7 for controlling the operation of the pass gate PG1 by inverting the phase of the source clock ISCK so as to output an inverted signal CLKB and performing a re-inversion so as to output a signal CLK.

With regards to the operation of the recovery information input counter 1221 having the above-described structure, the recovery information input counter 1221 starts a counting operation in response to a toggling of the predetermined command IWCDR to a logic high level while the recovery information enable signal WCDR_ENABLE is enabled to a logic high level.

Herein, the actual number of times of the counting may be different based on the logic levels of the plurality of the signals WL<1>, WL<2>, WL<3>, WL<4>, and WL<5> for defining the first number of times.

For example, when a fourth signal WL<4> among the plurality of the signals WL<1>, WL<2>, WL<3>, WL<4>, and WL<5> is enabled to a logic high level and the other signals WL<1>, WL<2>, WL<3>, and WL<5> are disabled to logic low levels, the counting operation begins from the NAND flip flop NAND FLIP FLOP4 corresponding to the fourth signal WL<4> among the NAND flip flops NAND FLIP FLOP2, NAND FLIP FLOP3, NAND FLIP FLOP4, and NAND FLIP FLOP5, and thus the recovery information input enable signal WCDRINEN is enabled to a logic high level in response to the fourth toggling of the period of the source clock ISCK.

Similarly, when a second signal WL<2> among the plurality of the signals WL<1>, WL<2>, WL<3>, WL<4>, and WL<5> is enabled to a logic high level and the other signals WL<1>, WL<3>, WL<4>, and WL<5> are disabled to logic low levels, the counting operation begins from the NAND flip flop NAND FLIP FLOP2 corresponding to the second signal WL<2> among the NAND flip flops NAND FLIP FLOP2, NAND FLIP FLOP3, NAND FLIP FLOP4, and NAND FLIP FLOP5, and thus the recovery information input enable signal WCDRINEN is enabled to a logic high level in response to the second toggling of the period of the source clock ISCK.

Referring to FIG. 3B, each of the NAND flip flops NAND FLIP FLOP2, NAND FLIP FLOP3, NAND FLIP FLOP4, and NAND FLIP FLOP5 of the recovery information input counter 1221 may include a first NAND gate ND1, a second NAND gate ND2, a first pass gate PG1, first and second inverters INV1 and INV2, a second pass gate PG2, and third to fifth inverters INV3, INV4 and INV5. Here, the first NAND gate ND1 performs a NAND operation onto an input signal IN_SIG (which includes VDD, IWCDR5B, IWCDR4B and IWCDR3B) and any one signal WL<x> among a plurality of signals WL<1>, WL<2>, WL<3>, WL<4>, and WL<5> except the least signal WL<1>. The second NAND gate ND2 performs a NAND operation onto an output signal of the first NAND gate ND1 and the counting start control signal WCDRD. The first pass gate PG1 passes an output signal of the second NAND gate ND2 in an enabled duration of the source clock ISCK. The first and second inverters INV1 and INV2 invert the phase of a signal transferred from the first pass gate PG1 and latch the inverted signal. The second pass gate PG2 passes the latched signal obtained from the latching in the first and second inverters INV1 and INV2 in a disabled duration of the source clock ISCK. The third to fifth inverters INV3, INV4 and INV5 latch a signal transferred from the second pass gate PG2 and output a signal OUT_ING (which includes IWCDR4B, IWCDR3B, and IWCDR2B). Also, each of the NAND flip flops NAND FLIP FLOP2, NAND FLIP FLOP3, NAND FLIP FLOP4, and NAND FLIP FLOP5 may further include sixth and seventh inverters INV6 and INV7 for controlling the operation of the first and second pass gates PG1 and PG2 by inverting the phase of the source clock ISCK so as to output an inverted signal CLKB and performing a re-inversion so as to output a signal CLK.

Each of the NAND flip flops NAND FLIP FLOP2, NAND FLIP FLOP3, NAND FLIP FLOP4, and NAND FLIP FLOP5 of the recovery information input counter 1221 operates as follows.

First, since the signal inputted to the first NAND flip flop in NAND FLIP FLOP5 among the plurality of the NAND flip flops NAND FLIP FLOP2, NAND FLIP FLOP3, NAND FLIP FLOP4, and NAND FLIP FLOP5 is power source voltage VDD, an output signal IWCDR5B is disabled to a logic low level in response to the fifth signal WL<5> among the plurality of the signals WL<1>, WL<2>, WL<3>, WL<4>, and WL<5> enabled to a logic high level, and an output signal IWCDR5B is enabled to a logic high level in response to the fifth signal WL<5> disabled to a logic low level.

The other NAND flip flops NAND FLIP FLOP2, NAND FLIP FLOP3, and NAND FLIP FLOP4 except the foremost NAND flip flop NAND FLIP FLOP5 among the plurality of the NAND flip flops NAND FLIP FLOP2, NAND FLIP FLOP3, NAND FLIP FLOP4, and NAND FLIP FLOP5 may operate differently based on the output signals IWCDR3B, IWCDR4B and IWCDR5B outputted from the front NAND flip flops NAND FLIP FLOP3, NAND FLIP FLOP4, and NAND FLIP FLOP5.

First, when the output signals IWCDR3B, IWCDR4B and IWCDR5B outputted from the front NAND flip flops NAND FLIP FLOP3, NAND FLIP FLOP4, and NAND FLIP FLOP5 are enabled to logic high levels, the other NAND flip flops NAND FLIP FLOP2, NAND FLIP FLOP3, and NAND FLIP FLOP4 except the foremost NAND flip flop NAND FLIP FLOP5 perform the same operation as that of the foremost NAND flip flop NAND FLIP FLOP5 among the NAND flip flops NAND FLIP FLOP2, NAND FLIP FLOP3, NAND FLIP FLOP4, and NAND FLIP FLOP5. In other words, the logic levels of the output signals IWCDR2B, IWCDR3B and IWCDR4B outputted based on the logic levels of the signals WL<1>, WL<2>, WL<3>, and WL<4> may become different.

On the other hand, when the signals IWCDR3B, IWCDR4B and IWCDR5B outputted from the front NAND flip flops NAND FLIP FLOP3, NAND FLIP FLOP4, and NAND FLIP FLOP5 are disabled to logic low levels the output signals IWCDR2B, IWCDR3B and IWCDR4B outputted regardless of the logic levels of the signals WL<1>, WL<2>, WL<3>, and WL<4> are disabled to logic low levels.

Therefore, as shown in the example, when the fourth signal WL<4> is enabled to a logic high level and the other signals WL<1>, WL<2>, WL<3>, and WL<5> are disabled to logic low levels, the NAND flip flop NAND FLIP FLOP4 receiving the fourth signal WL<4> outputs a signal IWCDR5B always enabled to a logic high level, and therefore, does not participate in the counting operation. Also, the NAND flip flop NAND FLIP FLOP4 receiving the fourth signal WL<4> disables the output signal IWCDR4B to a logic low level in response to a toggling of the source clock ISCK. The NAND flip flops NAND FLIP FLOP3 and NAND FLIP FLOP2 receiving the third signal WL<3> and the second signal WL<2> disable the output signals IWCDR3B and IWCDR2B to logic low levels in response to a toggling of the source clock ISCK after the output signals IWCDR4B and IWCDR3B are disabled to logic low levels.

In other words, whenever the source clock ISCK is toggled, the output signals IWCDR4B→IWCDR3B→IWCDR2B sequentially outputted from the NAND flip flop NAND FLIP FLOP4 receiving the fourth signal WL<4> to the NAND flip flop NAND FLIP FLOP2 receiving the second signal WL<2> are disabled to logic low levels. The signals are sequentially disabled whenever the source clock ISCK is toggled, as described above, and when the signal IWCDR2B outputted from the rearmost NAND flip flop NAND FLIP FLOP2 is disabled to a logic low level, the recovery information input enable signal WCDRINEN is enabled to a logic high level in response to a toggling of the next source clock ISCK. Therefore, it is possible to enable the recovery information input enable signal WCDRINEN to a logic high level at a moment when the source clock ISCK is toggled four times in response to the fourth signal WL<4> enabled to a logic high level.

Figure 4:
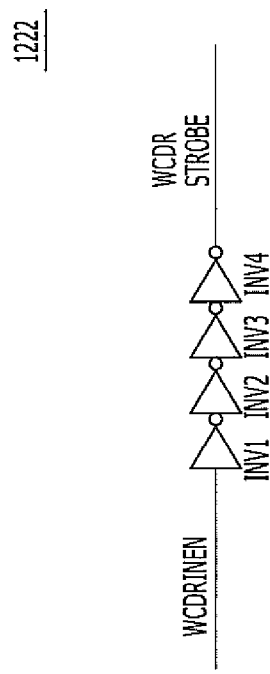
FIG. 4 is a circuit diagram illustrating a recovery information input latch signal toggling unit of the semiconductor memory device shown in FIGS. 1A and 1B.

FIG. 4 is a circuit diagram illustrating a recovery information input latch signal toggling unit of the semiconductor memory device shown in FIGS. 1A and 1B.

Referring to FIG. 4, the recovery information input latch signal toggling unit 1222 of the semiconductor memory device according to the embodiment of the present invention includes a plurality of inverters INV1, INV2, INV3 and INV4 serially connected to each other for receiving the recovery information input enable signal WCDRINEN outputted from the recovery information input counter 1221 and outputs the recovery information input enable signal WCDRINEN as a recovery information input latch signal WCDR STROBE with a predetermined time difference set up while maintaining its phase.

Figure 5:
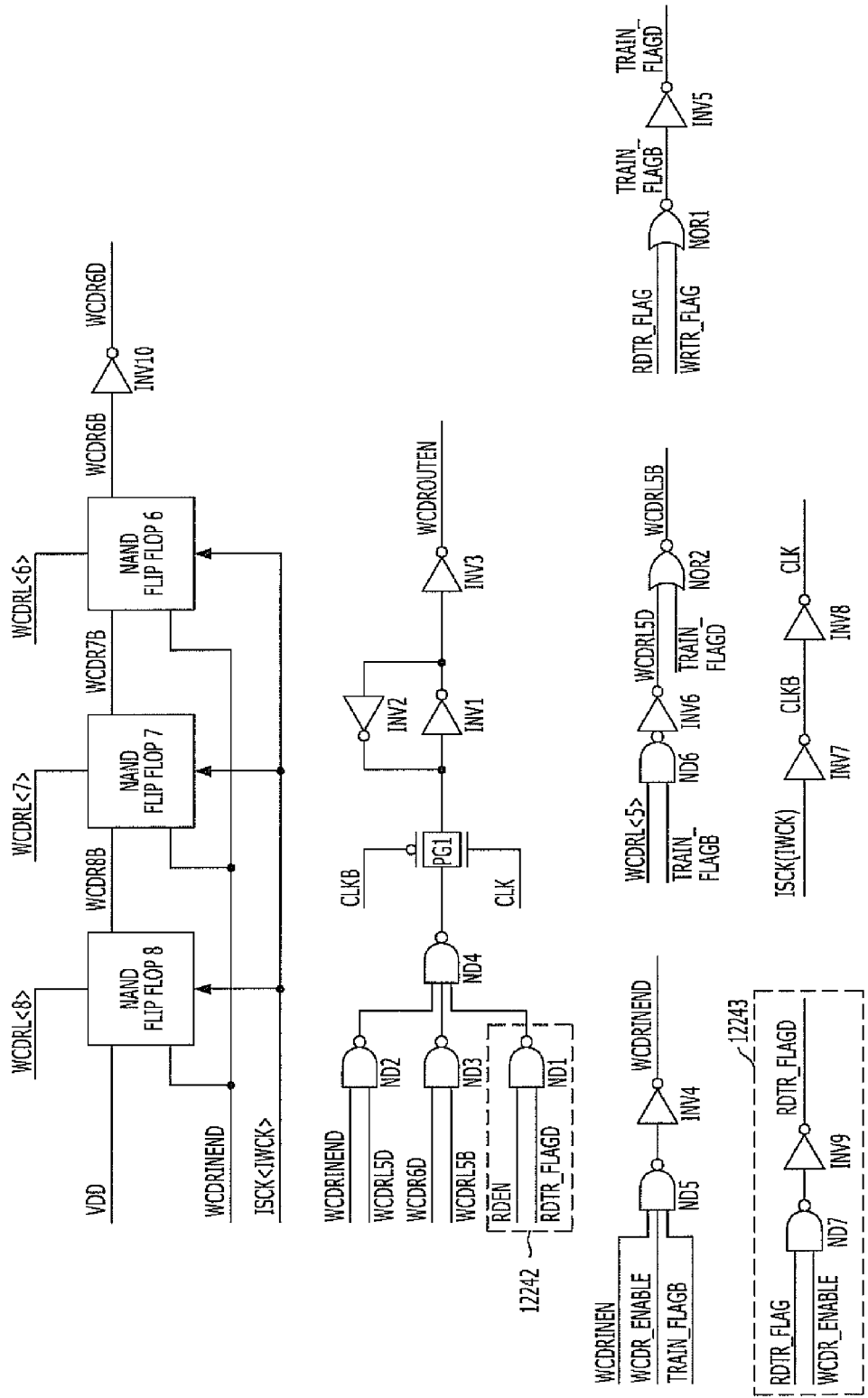
FIG. 5 is a circuit diagram illustrating first and second recovery information output enable signal toggling controllers of the semiconductor memory device shown in FIGS. 1A and 1B.

FIG. 5 is a circuit diagram illustrating first and second recovery information output enable signal toggling controllers of the semiconductor memory device shown in FIGS. 1A and 1B.

Referring to FIG. 5, the first and second recovery information output enable signal toggling controllers 1224 of the semiconductor memory device according to the exemplary embodiment of the present invention performs an operation of a first recovery information output enable signal toggling controller 1224 and an operation of a second recovery information output enable signal toggling controllers 1224 based on the logic levels of the training input command sense signal WRTR_FLAG and the training output command sense signal RDTR_FLAG.

In other words, when the training output command IRDTR is inputted and the training output command sense signal RDTR_FLAG is enabled to a logic high level and the training input command sense signal WRTR_FLAG is disabled to a logic low level, the first recovery information output enable signal toggling controller 1224 performs an operation for toggling the recovery information output enable signal WCDROUTEN in response to a normal output enable signal RDEN (which is toggled at a moment when the period of the source clock ISCK is counted two times) outputted from the normal output counter 1021.

On the other hand, when the predetermined command IWCDR is inputted and the training output command sense signal RDTR_FLAG is disabled to a logic low level and the training input command sense signal WRTR_FLAG is enabled to a logic high level, the second recovery information output enable signal toggling controller 1224 counts the period of the source clock ISCK in the third number of times in response to a toggling of the recovery information input enable signal WCDRINEN outputted from the recovery information input counter 1221 and performs an operation for toggling the recovery information output enable signal WCDROUTEN in response to completion of the counting.

To be specific, the first and second recovery information output enable signal toggling controllers 1224 may include a first NOR gate NOR1, a first inverter INV5, a first NAND gate ND5 and a second inverter INV4, a second NAND gate ND8 and a third inverter INV9, a third NAND gate ND1, a plurality of NAND flip flops NAND FLIP FLOP6, NAND FLIP FLOP7, and NAND FLIP FLOP8, a fourth inverter INV10, a fourth NAND gate ND6 and a fifth inverter INV6, a second NOR gate NOR2, a fifth NAND gate ND2, a sixth NAND gate ND3, a seventh NAND gate ND4, a pass gate PG1, sixth to eighth inverters INV1, INV2 and INV3. Also, the first and second recovery information output enable signal toggling controllers 1224 may further include ninth and tenth inverters INV7 and INV8 for controlling an operation of the pass gate PG1 by inverting the phase of the source clock ISCK so as to output an output signal CLKB and performing a re-inversion so as to output an output signal CLK.

The first NOR gate NOR1 performs a NOR operation onto the training input command sense signal WRTR_FLAG and the training output command sense signal RDTR_FLAG and outputs a first training mixed sense signal TRAIN_FLAGB. The first inverter INV5 inverts the phase of the first training mixed sense signal TRAIN_FLAGB and outputs a second training mixed sense signal TRAIN_FLAGD. The first NAND gate ND5 and the second inverter INV4 perform an AND operation onto the first training mixed sense signal TRAIN_FLAGB, the recovery information input enable signal WCDRINEN, and the recovery information enable signal WCDR_ENABLE and output a mixed recovery information input enable signal WCDRINEND. The second NAND gate ND7 and the third inverter INV9 perform an AND operation onto the training output command sense signal RDTR_FLAG and the recovery information enable signal WCDR_ENABLE and output a mixed training output command sense signal RDTR_FLAGD. The third NAND gate ND1 performs a NAND operation onto the normal output enable signal RDEN and the mixed training output command sense signal RDTR_FLAGD. The plurality of the NAND flip flops NAND FLIP FLOP6, NAND FLIP FLOP7, and NAND FLIP FLOP8, which are connected in series to form a chain type structure, receive the source clock ISCK as a clock signal, receive as an input control signal any one signal except the least signal WCDRL<5> among a plurality of signals WCDRL<5>, WCDRL<6>, WCDRL<7> and WCDRL<8> for defining a third number of times, and begin operating in response to the mixed recovery information input enable signal WCDRINEND. The fourth inverter INV10 inverts the phase of a signal WCDR6B outputted from the rearmost NAND flip flop NAND FLIP FLOP6 among the plurality of the NAND flip flops NAND FLIP FLOP6, NAND FLIP FLOP7, and NAND FLIP FLOP8 and outputs a signal WCDR6D. The fourth NAND gate ND6 and the fifth inverter INV6 perform an AND operation onto the least signal WCDRL<5> among the plurality of the signals WCDRL<5>, WCDRL<6>, WCDRL<7> and WCDRL<8> for defining the third number of times and the first training mixed sense signal TRAIN_FLAGB and output a first least number defining signal WCDRL5D. The second NOR gate NOR2 performs a NOR operation onto the first least number defining signal WCDRL5D and the second training mixed sense signal TRAIN_FLAGD and outputs a second least number defining signal WCDRL5B. The fifth NAND gate ND2 performs a NAND operation onto the mixed recovery information input enable signal WCDRINEND and the first least number defining signal WCDRL5D. The sixth NAND gate ND3 performs a NAND operation onto the output signal WCDR6D of the fourth inverter INV10 and the second least number defining signal WCDRL5B. The seventh NAND gate ND4 performs a NAND operation onto an output signal of the third NAND gate ND1, an output signal of the fifth NAND gate ND5, and an output signal of the sixth NAND gate ND6. The pass gate PG1 synchronizes an output signal of the seventh NAND gate ND4 with the source clock ISCK. The sixth to eighth inverters INV1, INV2 and INV3 latch an output signal outputted from the pass gate PG1 and outputs the recovery information output enable signal WCDROUTEN.

To have a look at the operations of the first and second recovery information output enable signal toggling controllers 1224, the first and second recovery information output enable signal toggling controllers 1224 toggles the recovery information output enable signal WCDROUTEN to a logic high level, regardless of the logic level of the training input command sense signal WRTR_FLAG in response to a toggling of the normal output enable signal RDEN being toggled to a logic high level while the recovery information enable signal WCDR_ENABLE is enabled to a logic high level and the training output command sense signal RDTR_FLAG is enabled to a logic high level.

When the training input command sense signal WRTR_FLAG is enabled to a logic high level and the training output command sense signal RDTR_FLAG is disabled to a logic low level while the recovery information enable signal WCDR_ENABLE is enabled to a logic high level, a counting operation begins in response to a toggling of the recovery information input enable signal WCDRINEN to a logic high level.

Herein, the actual number of times of the counting operations may be different based on the logic levels of the plurality of the signals WCDRL<5>, WCDRL<6>, WCDRL<7> and WCDRL<8> for defining the third number of times.

For example, when a seventh signal WCDRL<7> is enabled to a logic high level and the other signals WCDRL<5>, WCDRL<6>, and WCDRL<8> are disabled to logic low levels, the counting operation starts from a NAND flip flop NAND FLIP FLOP7 which receives the seventh signal WCDRL<7> and the recovery information output enable signal WCDROUTEN is enabled to a logic high level in response to the third toggling of the period of the source clock ISCK.

Similarly, when a sixth signal WCDRL<6> is enabled to a logic high level and the other signals WCDRL<5>, WCDRL<7>, and WCDRL<8> are disabled to logic low levels, the counting operation starts from a NAND flip flop NAND FLIP FLOP6 which receives the sixth signal WCDRL<6> and the recovery information input enable signal WCDRINEN is enabled to a logic high level in response to the second toggling of the period of the source clock ISCK.

Figure 6A:
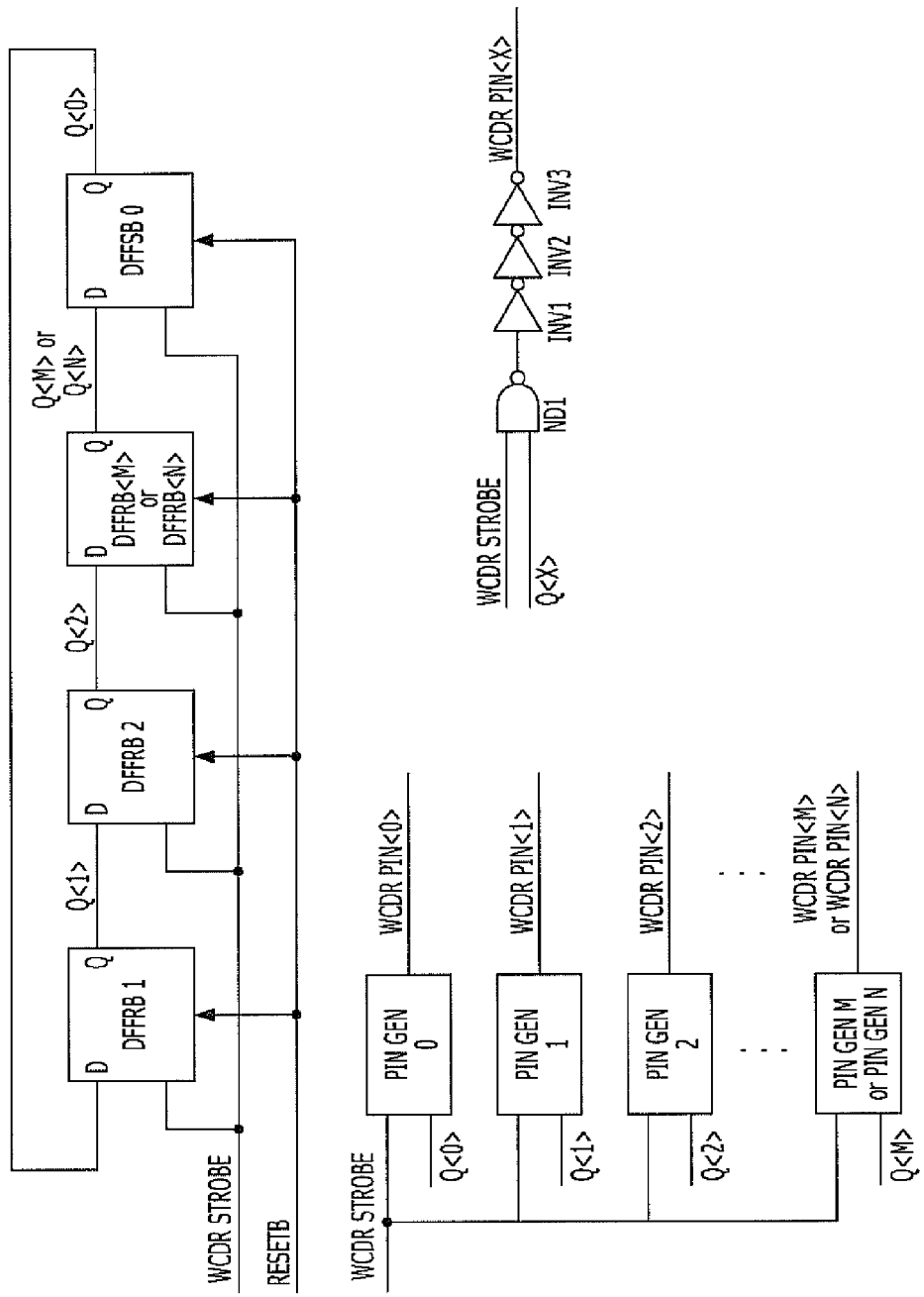
FIG. 6A is a circuit diagram illustrating an internal input strobe signal toggling unit of the semiconductor memory device shown in FIGS. 1A and 1B.
Figure 6B:
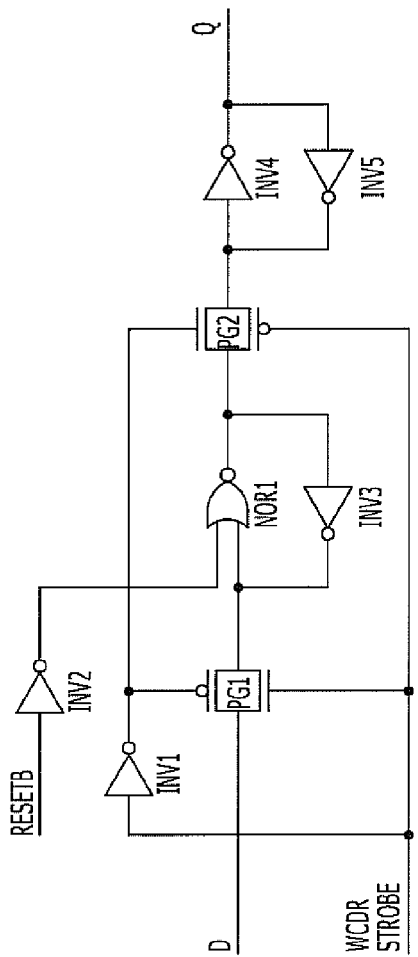
FIG. 6B is a circuit diagram illustrating a plurality of serial flip flops of the internal input strobe signal toggling unit shown in FIG. 6A.
Figure 6C:
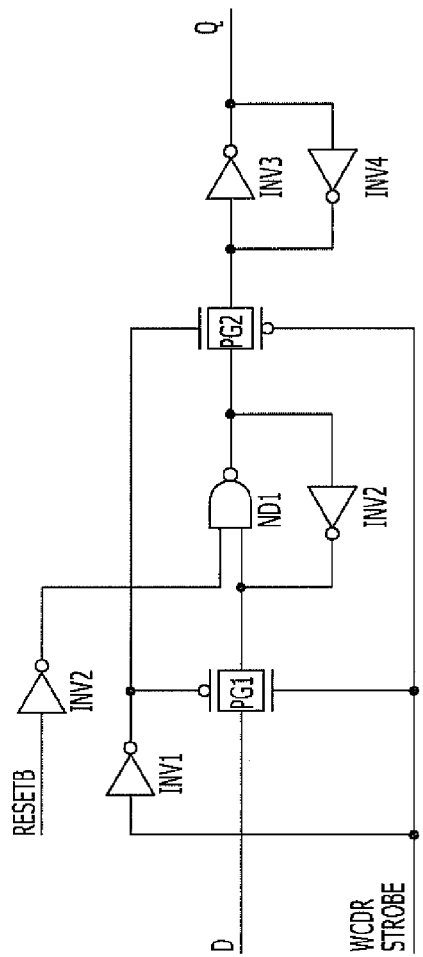
FIG. 6C is a circuit diagram illustrating a feedback flip flop of the internal input strobe signal toggling unit shown in FIG. 6A.

FIG. 6A is a circuit diagram illustrating an internal input strobe signal toggling unit of the semiconductor memory device shown in FIGS. 1A and 1B. FIG. 6B is a circuit diagram illustrating a plurality of serial flip flops of the internal input strobe signal toggling unit shown in FIG. 6A. FIG. 6C is a circuit diagram illustrating a feedback flip flop of the internal input strobe signal toggling unit shown in FIG. 6A.

Referring to FIG. 6A, the internal input strobe signal toggling unit 1223 of the semiconductor memory device according to the embodiment of the present invention includes a plurality of serial flip flops DFFRB1, DFFRB2, . . . , DFFRBM or DFFRBN connected to each other to form a chain type structure, one feedback flip flop DFFSB, and a plurality of internal input strobe signal generators PIN GEN0, PIN GEN1, PIN GEN2, . . . , PIN GENM or PIN GENN. The plurality of the serial flip flops DFFRB1, DFFRB2, . . . , DFFRBM or DFFRBN and the feedback flip flop DFFSB count a plurality of output control signals Q<0>, Q<1>, Q<2>, . . . , Q<M> or Q<N>, circling the plurality of the output control signals in a predetermined number of times ( . . . →Q<M> or Q<N>→Q<0>→Q<1>→Q<2>→ . . . →Q<M> or Q<N>→Q<0>→ . . . ) in response to a toggling of the recovery information input latch signal WCDR STROBE. The plurality of the internal input strobe signal generators PIN GEN0, PIN GEN1, PIN GEN2, . . . , PIN GENM or PIN GENN generate a first internal input strobe signal WCDR PIN<0:M> or a second internal input strobe signal WCDR PIN<0:N> in response to any one signal among the plurality of the output control signals Q<0>, Q<1>, Q<2>, . . . , Q<M> or Q<N> and the recovery information input latch signal WCDR STROBE.

Herein, each of the plurality of the internal input strobe signal generators PIN GEN0, PIN GEN1, PIN GEN2, . . . , PIN GENM or PIN GENN includes a NAND gate ND1 for performing a NAND operation onto the recovery information input latch signal WCDR STROBE and any one signal Q<X> among the plurality of the output control signals Q<0>, Q<1>, Q<2>, . . . , Q<M> or Q<N>, and a plurality of inverters INV1, INV2 and INV3 for inverting the phase of a signal outputted from the NAND gate ND1, delaying the signal for a certain period of time, and outputting the delayed signal as any one signal WCDR PIN<x> among the first internal input strobe signals WCDR PIN<0:M> and the second internal input strobe signals WCDR PIN<0:N>.

The plurality of the serial flip flops DFFRB1, DFFRB2, ..., DFFRBM or DFFRBN and the feedback flip flop DFFSB initialize its operation in response to a reset signal RESETB, and accordingly, all of the plurality of the output control signals Q<0>, Q<1>, Q<2>, ..., Q<M> or Q<N> are initialized.

In FIG. 6A, it is shown that the constituent elements for generating the first internal input strobe signals WCDR PIN<0:M> and the constituent elements for generating the second internal input strobe signals WCDR PIN<0:N> are overlapped. If the value M and the value N are the same, there is no problem in overlapping the constituent elements. However, generally the value M and the value N are different, and thus, the constituent elements for generating the first internal input strobe signals WCDR PIN<0:M> and the constituent elements for generating the second internal input strobe signals WCDR PIN<0:N> may be independent. Of course, the constituent elements may be different according to the design intention of a designer. They may be designed to be the same as shown in the drawing, or some constituent elements may be shared and the other constituent elements may not be shared.

Referring to FIG. 6B, the feedback flip flop DFFSB illustrated in FIG. 6A includes a first pass gate PG1, a NOR gate NOR1 and a first inverter INV3, a second pass gate PG2, and second and third inverters INV4 and INV5. The first pass gate PG1 passes a signal applied through an input terminal D in an enabled duration of the recovery information input latch signal WCDR STROBE. The NOR gate NOR1 and the first inverter INV3 latch and output a signal transferred through the first pass gate PG1 in a phase-inverted state or initializes the signal to a logic low level and outputs it in response to an inverted reset signal RESET. The second pass gate PG2 passes the latched signal obtained from the NOR gate NOR1 and the first inverter INV3 in a disabled duration of the source clock ISCK. The second and third inverters INV4 and INV5 latch a signal transferred through the second pass gate PG2 in a phase inverted state and transfer the latched signal to an output terminal Q.

Referring to FIG. 6C, each of the plurality of the serial flip flops DFFRB1, DFFRB2, ..., DFFRBM or DFFRBN illustrated in FIG. 6A may include a first pass gate PG1, a NAND gate ND1 and a first inverter INV2, a second pass gate PG2, and second and third inverters INV3 and INV4. The first pass gate PG1 passes a signal applied through an input terminal D in an enabled duration of the recovery information input latch signal WCDR STROBE. The NAND gate ND1 and the first inverter INV2 latch and output a signal transferred through the first pass gate PG1 in a phase-inverted state or initialize the signal to a logic high level and output it in response to a reset signal RESETB. The second pass gate PG2 passes the latched signal obtained from the NAND gate ND1 and the first inverter INV2 in a disabled duration of the recovery information input latch signal WCDR STROBE. The second and third inverters INV3 and INV4 latch a signal transferred through the second pass gate PG2 in a phase inverted state and transfer the latched signal to an output terminal Q.

Figure 7A:
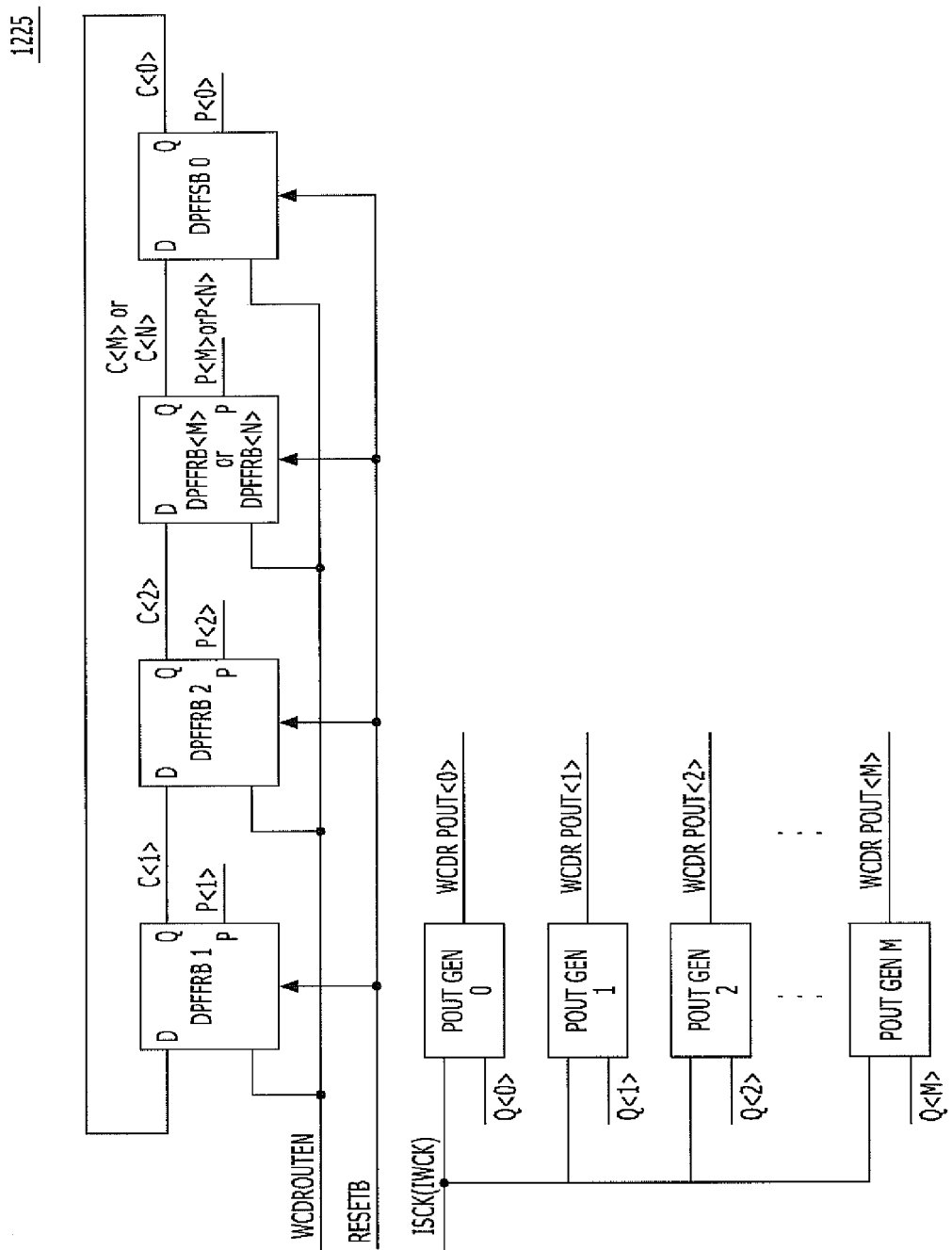
FIG. 7A is a circuit diagram illustrating an internal output strobe signal toggling unit of the semiconductor memory device shown in FIGS. 1A and 1B.
Figure 7B:
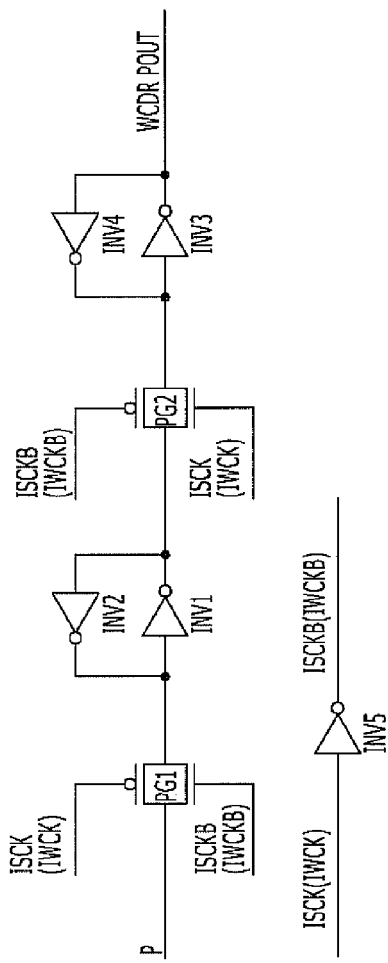
FIG. 7B is a circuit diagram illustrating each of a plurality of internal output strobe signal generators shown in FIG. 7A.
Figure 7C:
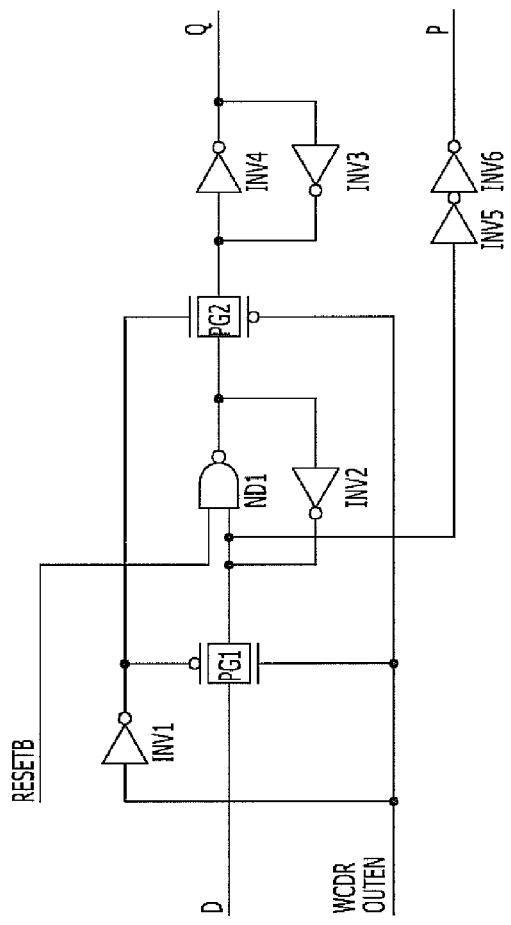
FIG. 7C is a circuit diagram illustrating each of a plurality of serial flip flops of the internal output strobe signal toggling unit shown in FIG. 7A.
Figure 7D:
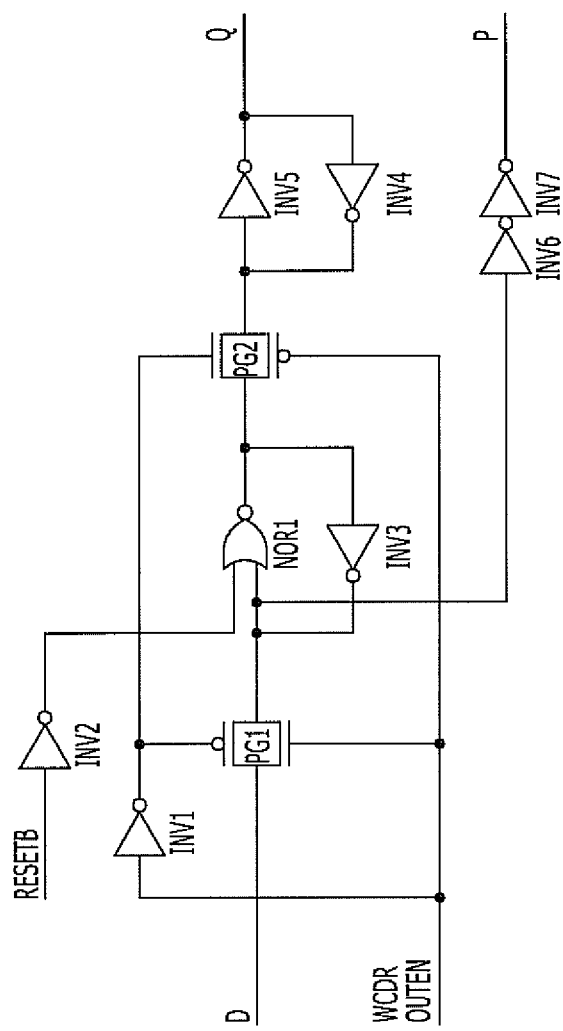
FIG. 7D is a circuit diagram illustrating one feedback flip flop of the internal output strobe signal toggling unit shown in FIG. 7A.

FIG. 7A is a circuit diagram illustrating an internal output strobe signal toggling unit of the semiconductor memory device shown in FIGS. 1A and 1B. FIG. 7B is a circuit diagram illustrating each of a plurality of internal output strobe signal generators shown in FIG. 7A. FIG. 7C is a circuit diagram illustrating each of a plurality of serial flip flops of the internal output strobe signal toggling unit shown in FIG. 7A. FIG. 7D is a circuit diagram illustrating one feedback flip flop of the internal output strobe signal toggling unit shown in FIG. 7A.

Referring to FIG. 7A, the internal output strobe signal toggling unit 1225 of the semiconductor memory device according to an exemplary embodiment of the present invention includes a plurality of serial flip flops DPFFRB1, DPFFRB2, ..., DPFFRBM or DPFFRBN connected to each other to form a chain type structure, one feedback flip flop DPFFSB, and a plurality of internal output strobe signal generators POUT GEN0, POUT GEN1, POUT GEN2, ..., POUT GENM or POUT GENN. The plurality of the serial flip flops DPFFRB1, DPFFRB2, ..., DPFFRBM or DPFFRBN and the feedback flip flop DPFFSB count a plurality of counting control signals C<0>, C<1>, C<2>, ..., C<M> or C<N>, circling the plurality of the counting control signals in a predetermined period ( . . . →C<M> or C<N>→C<0>→C<1>→C<2>→ . . . →C<M> or C<N>→C<0>→ . . . ) in response to a toggling of the recovery information output enable signal WCDROUTEN, and generates a plurality of output control signals P<0>, P<1>, P<2>, ..., P<M> or P<N> corresponding to the counting. The plurality of the internal output strobe signal generators POUT GEN0, POUT GEN1, POUT GEN2, ..., POUT GENM or POUT GENN generate a first internal output strobe signal WCDR POUT<0:M> or a second internal output strobe signal WCDR POUT<0:N> in response to any one signal among the plurality of the output control signals P<0>, P<1>, P<2>, ..., P<M> or P<N> and the source clock ISCK.

Referring to FIG. 7B, each of the plurality of the internal output strobe signal generators POUT GEN0, POUT GEN1, POUT GEN2, ..., POUT GENM or POUT GENN includes a first pass gate PG1, first and second inverters INV1 and INV2, a second pass gate PG2, and third and fourth inverters INV3 and INV4. The first pass gate PG1 passes any one signal Q<X> among the plurality of the output control signals P<0>, P<1>, P<2>, ..., P<M> or P<N> in an enabled duration of the source clock ISCK. The first and second inverters INV1 and INV2 invert the phase of a signal transferred through the first pass gate PG1 and latch the inverted signal. The second pass gate PG2 passes the latched signal obtained from the first and second inverters INV1 and INV2 in a disabled duration of the source clock ISCK. The third and fourth inverters INV3 and INV4 latch a signal transferred through the second pass gate PG2, invert the phase of the latched signal, and output the latched signal as a first internal output strobe signal WCDR POUT<0:M> or a second internal output strobe signal WCDR POUT<0:N>. Also, each of the plurality of the internal output strobe signal generators POUT GEN0, POUT GEN1, POUT GEN2, ..., POUT GENM or POUT GENN may further include a fifth inverter INV5 for controlling the operations of the first and second pass gates PG1 and PG2 by inverting the phase of the source clock ISCK so as to output a signal ISCKB.

The plurality of the serial flip flops DPFFRB1, DPFFRB2, ..., DPFFRBM or DPFFRBN and the feedback flip flop DPFFSB are initialized in response to a reset signal RESETB, and accordingly, all of the plurality of the counting control signals C<0>, C<1>, C<2>, ..., C<M> or C<N> and the plurality of the output control signals P<0>, P<1>, P<2>, ..., P<M> or P<N> are initialized.

In FIG. 7A, it is shown that the constituent elements for generating the first internal output strobe signals WCDR POUT<0:M> and the constituent elements for generating the second internal output strobe signals WCDR POUT<0:N> are overlapped. If the value M and the value N are the same, there is no problem in overlapping the constituent elements.

However, generally the value M and the value N are different, and thus, the constituent elements for generating the first internal output strobe signals WCDR POUT<0:M> and the constituent elements for generating the second internal output strobe signals WCDR POUT<0:N> may be independent. Of course, the constituent elements may be different according to the design intention of a designer. They may be designed to be the same as shown in the drawing, or some constituent elements may be shared and the other constituent elements may not be shared.

Referring to FIG. 7C, the feedback flip flop DPFFSB illustrated in FIG. 7A includes a first pass gate PG1, a NAND gate ND1 and a first inverter INV2, second and third inverters INV5 and INV6, a second pass gate PG2, and fourth and fifth inverters INV3 and INV4. The first pass gate PG1 passes a signal applied through an input terminal D in an enabled duration of the recovery information output enable signal WCDROUTEN. The NAND gate ND1 and the first inverter INV2 latch and output a signal transferred through the first pass gate PG1 in a phase-inverted state or initialize the signal to a logic high level and output it in response to a reset signal RESETB. The second and third inverters INV5 and INV6 drive a signal outputted through the first inverter INV2 to an output control signal output terminal P. The second pass gate PG2 passes the latched signal obtained from the NAND gate ND1 and the first inverter INV2 in a disabled duration of the recovery information output enable signal WCDROUTEN. The fourth and fifth inverters INV3 and INV4 latch a signal transferred through the second pass gate PG2 in a phase-inverted state and transfer the latched signal to a counting control signal output terminal C.

Referring to FIG. 7D, each of the serial flip flops DPFFRB1, DPFFRB2, . . . , DPFFRBM or DPFFRBN illustrated in FIG. 7A may include a first pass gate PG1, a NOR gate NOR1 and a first inverter INV3, second and third inverters INV6 and INV7, a second pass gate PG2, and fourth and fifth inverters INV4 and INV5. The first pass gate PG1 passes a signal applied through an input terminal D in an enabled duration of recovery information output enable signal WCDROUTEN. The NOR gate NOR1 and the first inverter INV3 latch and output a signal transferred through the first pass gate PG1 in a phase-inverted state or initialize the signal to a logic low level and output it in response to an inverted reset signal RESET. The second and third inverters INV6 and INV7 drive a signal outputted through the first inverter INV3 to an output control signal output terminal P. The second pass gate PG2 passes the latched signal obtained from the NOR gate NOR1 and the first inverter INV3 in a disabled duration of the recovery information output enable signal WCDROUTEN. The fourth and fifth inverters INV4 and INV5 latch a signal transferred through the second pass gate PG2 in a phase-inverted state and transfer the latched signal to a counting control signal output terminal C.

Figure 8A:
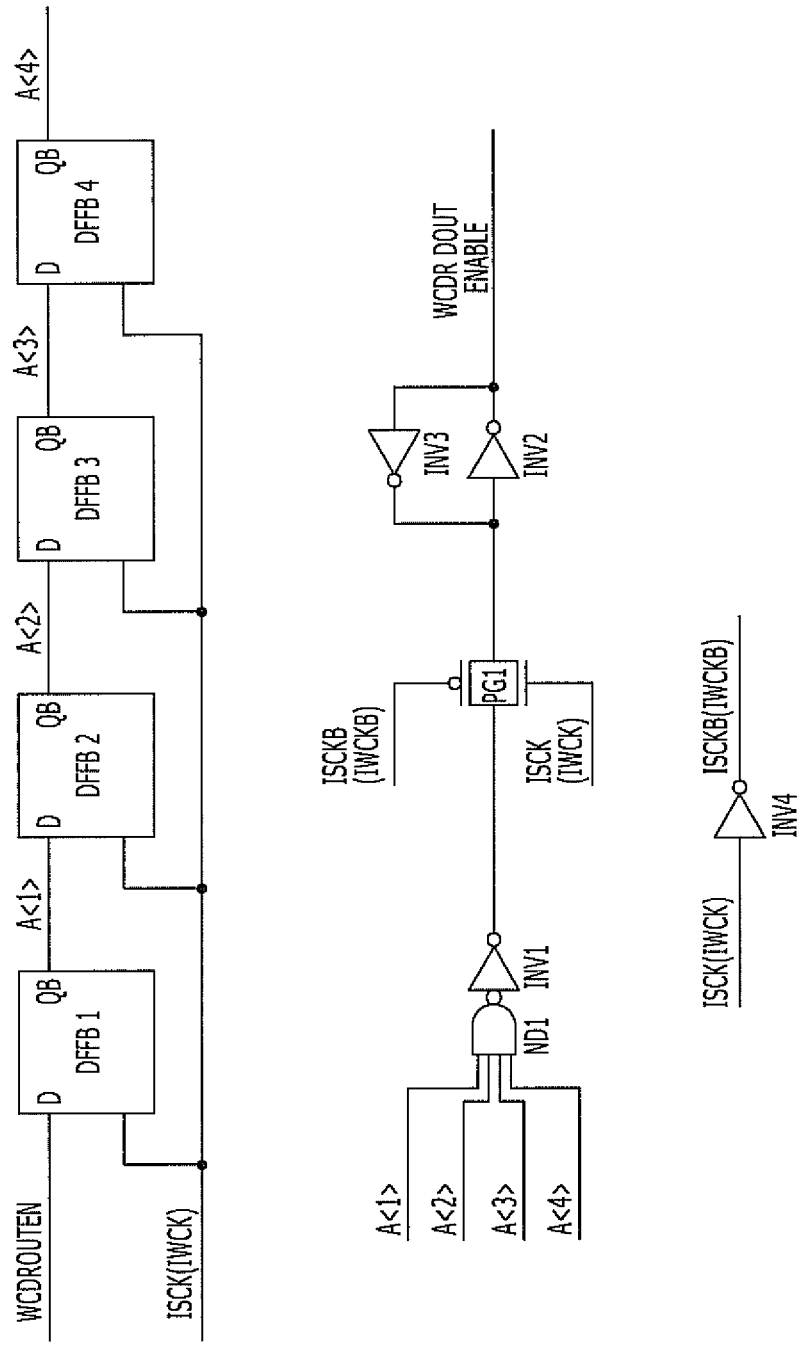
FIG. 8A is a circuit diagram illustrating a recovery information output driver enable signal toggling unit of the semiconductor memory device shown in FIGS. 1A and 1B.
Figure 8B:
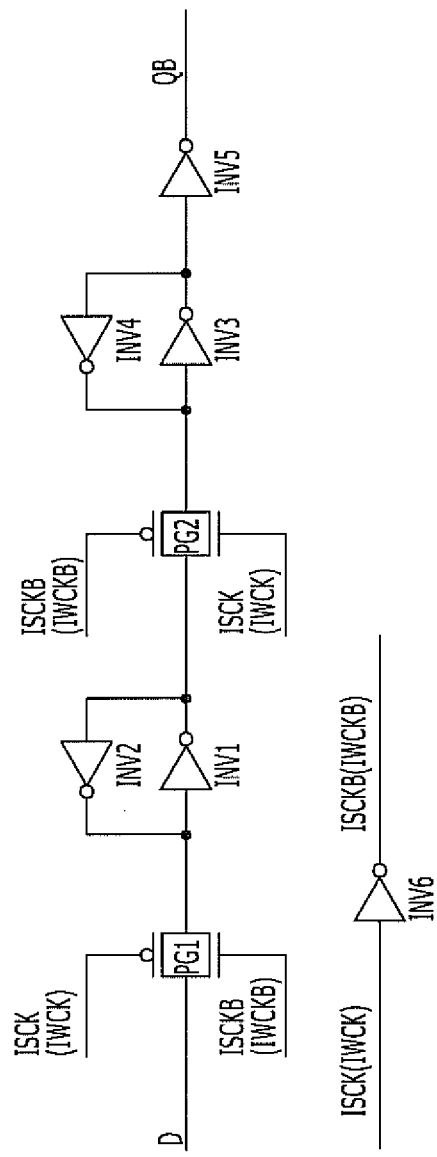
FIG. 8B is circuit diagram illustrating a plurality of serial flip flops of the recovery information output driver enable signal toggling unit shown in FIG. 1A.

FIG. 8A is a circuit diagram illustrating a recovery information output driver enable signal toggling unit of the semiconductor memory device shown in FIGS. 1A and 1B. FIG. 8B is circuit diagram illustrating a plurality of serial flip flops of the recovery information output driver enable signal toggling unit shown in FIG. 1A.

Referring to FIG. 8A, the recovery information output driver enable signal toggling unit 1226 of the semiconductor memory device includes a plurality of serial flip flops DFFB1, DFFB2, . . . , DFFBM or DFFBN connected to each other to form a chain type structure, a NAND gate ND1 and a first inverter INV1, a first pass gate PG1, and second and third inverters INV2 and INV3. The plurality of serial flip flops DFFB1, DFFB2, . . . , DFFBM or DFFBN sequentially toggle a plurality of bit output control signals A<1>, A<2>, A<3>, and A<4> in response to a toggling of the recovery information output enable signal WCDROUTEN whenever the source clock ISCK is toggled. The NAND gate ND1 and the first inverter INV1 receive the plurality of the bit output control signals A<1>, A<2>, A<3>, and A<4> and perform an AND operation. The first pass gate PG1 passes a signal outputted through the NAND gate ND1 and the first inverter INV1 in an enabled duration of the source clock ISCK. The second and third inverters INV2 and INV3 latch a signal transferred through the pass gate PG1, invert the phase, and output a recovery information output driver enable signal WCDR DOUT ENABLE. Also, the recovery information output driver enable signal toggling unit 1226 further includes a fourth inverter INV4 for controlling the operation of the pass gate PG1 by inverting the phase of the source clock ISCK so as to output a signal ISCKB.

Referring to FIG. 8B, each of the plurality of the serial flip flops DFFB1, DFFB2, DFFB3, and DFFB4 may include a first pass gate PG1, first and second inverter INV1 and INV2, a second pass gate PG2, and third to fifth inverters INV3, INV4 and INV 5. The first pass gate PG1 passes a signal applied through an input terminal D in an enabled duration of the source clock ISCK. The first and second inverter INV1 and INV2 latch and output a signal transferred through the first pass gate PG1 in a phase-inverted state. The second pass gate PG2 passes the latched signal obtained from the first and second inverter INV1 and INV2 in a disabled duration of the source clock ISCK. The third to fifth inverters INV3, INV4 and INV 5 latch a signal transferred through the second pass gate PG2 in a phase-inverted state and transfer the latched signal to an inversion output terminal QB. Also, each of the plurality of the serial flip flops DFFB1, DFFB2, DFFB3, and DFFB4 may further include a sixth inverter INV6 for controlling the operations of the first and second pass gates PG1 and PG2 by inverting the source clock ISCK so as to output an inverted source clock ISCKB.

Figure 9:
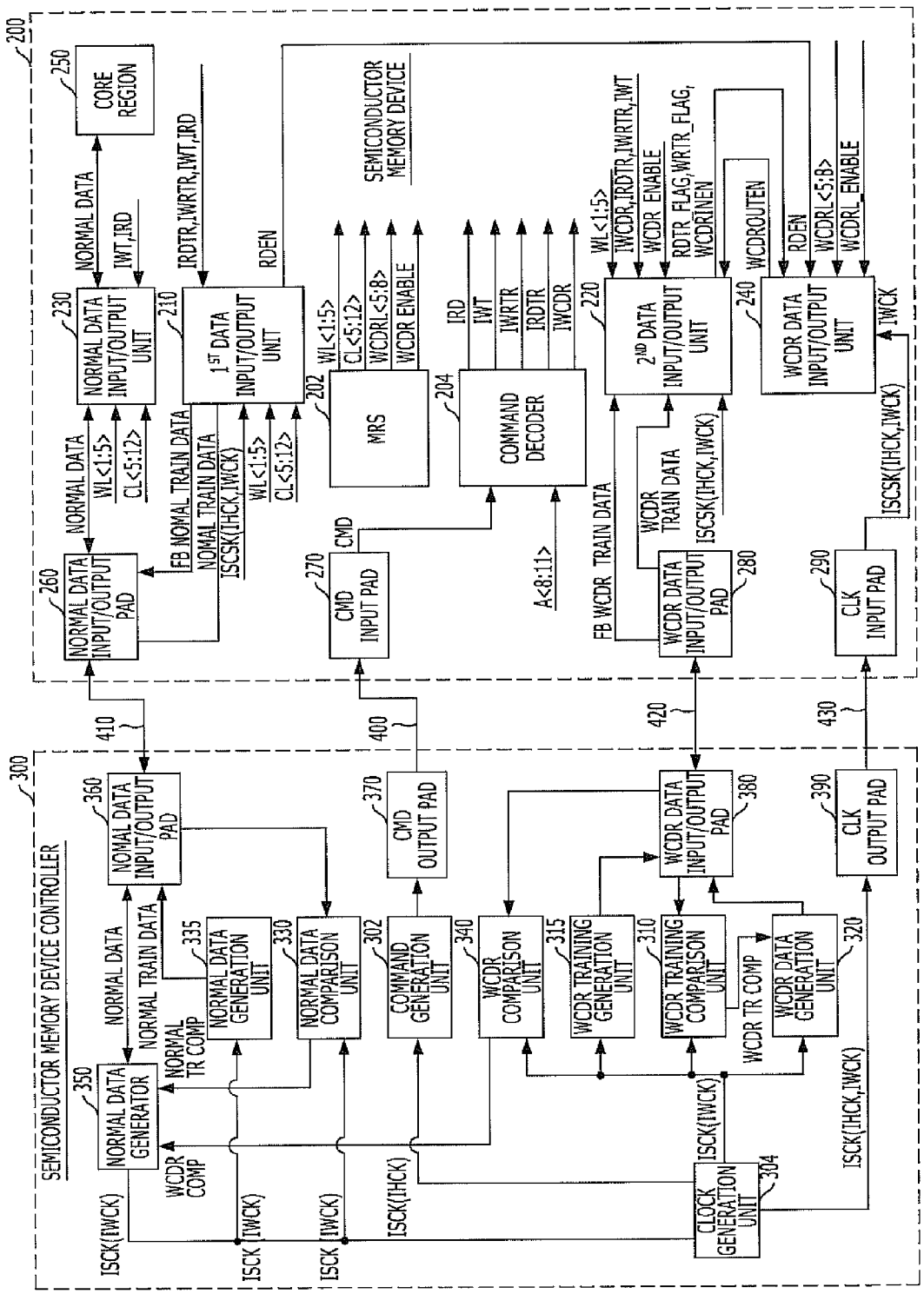
FIG. 9 is a block diagram illustrating a semiconductor system including the semiconductor memory device shown in FIGS. 1A and 1B.

FIG. 9 is a block diagram illustrating a semiconductor system including the semiconductor memory device shown in FIGS. 1A and 1B.

Referring to FIG. 9, a semiconductor system including a semiconductor memory device 200 and a semiconductor memory device controller 300 and inputs/outputs a normal data NORMAL DATA and recovery information data WCDR DATA between the semiconductor memory device 200 and the semiconductor memory device controller 300. The semiconductor memory device controller 300 transfers recovery information training data WCDR TRAIN DATA to the semiconductor memory device 200 at a first moment determined according to a training input command IWRTR generated internally, and controls the phase of the recovery information data WCDR DATA transferred to the semiconductor memory device 200 in response to a feedback recovery information training data FB WCDR TRAIN DATA applied from the semiconductor memory device 200 at a second moment determined according to the training output command IRDTR generated internally. The semiconductor memory device 200 receives the recovery information training data WCDR TRAIN DATA from the semiconductor memory device controller 300 at a first moment determined according to the training input command IWRTR, and transfers a feedback recovery information training data FB WCDR TRAIN DATA to the semiconductor memory device controller 300 at a second moment determined according to the training output command IRDTR.

Herein, the semiconductor memory device controller 300 includes a recovery information training comparison unit 310, a recovery information training generation unit 315, a recovery information data generation unit 320, a normal training comparison unit 330, a normal training generation unit 335, a recovery information comparison unit 340, a normal data generation unit 350, a normal data input/output pad 360, a command output pad 370, a recovery information data input/output pad 380, a clock output pad 390, a command generation unit 302, and a clock generation unit 304.

The semiconductor memory device 200 includes a first data input/output unit 210, a second data input/output unit 220, a normal data input/output unit 230, a recovery information data input/output unit 240, a core region 250, a normal data input/output pad 260, a command input pad 270, a recovery information data input/output pad 280, a clock input pad 290, a memory register set (MRS) 202, and a command decoder 204.

To be specific, the command generation unit 302 of the semiconductor memory device controller 300 generates the training input command IWRTR, the training output command IRDTR, and the predetermined command IWCDR.

Also, the recovery information training comparison unit 310 of the semiconductor memory device controller 300 compares the data value of the recovery information training data WCDR TRAIN DATA with the data value of the feedback recovery information training data FB WCDR TRAIN DATA, and generates a comparison signal WCDR TR COMP based on the comparison result.

Further, the recovery information data generation unit 320 of the semiconductor memory device controller 300 generates the recovery information data WCDR DATA corresponding to the predetermined command IWCDR while changing the phase based on the comparison signal WCDR TR COMP.

The normal training comparison unit 330 of the semiconductor memory device controller 300 compares a data value of a normal training data NORMAL TRAIN DATA with a data value of a feedback normal training data FB NORMAL TRAIN DATA, and generates a normal training comparison signal NORMAL TR COMP.

The recovery information comparison unit 340 of the semiconductor memory device controller 300 compares a data value of a recovery information data WCDR DATA with a data value of a feedback recovery information data FB WCDR DATA, and generates a recovery information comparison signal WCDR COMP.

The normal data generation unit 350 of the semiconductor memory device controller 300 generates a normal data NORMAL DATA in response to a write command IWT, and the phase of the generated normal data NORMAL DATA is changed based on the normal training comparison signal NORMAL TR COMP or the recovery information comparison signal WCDR COMP.

Therefore, the command output pad 370 of the semiconductor memory device controller 300 outputs a training input command IWRTR, a training output command IRDTR, and a predetermined command IWCDR.

Likewise, the normal data input/output pad 360 of the semiconductor memory device controller 300 inputs/outputs a normal data NORMAL DATA, a normal training data NORMAL TRAIN DATA, and a feedback normal training data FB NORMAL TRAIN DATA.

The recovery information data input/output pad 380 of the semiconductor memory device controller 300 inputs/outputs a recovery information data WCDR DATA, a feedback recovery information data FB WCDR DATA, a recovery information training data WCDR TRAIN DATA, and a feedback recovery information training data FB WCDR TRAIN DATA.

The clock output pad 390 of the semiconductor memory device controller 300 outputs a source clock ISCK.

The first data input/output unit 210 of the semiconductor memory device 200 receives and stores the normal training data NORMAL TRAIN DATA in response to the training input command IWRTR, and outputs the feedback normal training data FB NORMAL TRAIN DATA in response to the training output command IRDTR.

The second data input/output unit 220 of the semiconductor memory device 200 receives and stores the recovery information training data WCDR TRAIN DATA in response to the training input command IWRTR, and outputs the feedback recovery information training data FB WCDR TRAIN DATA in response to the training output command IRDTR.

The normal data input/output unit 230 of the semiconductor memory device 200 receives and stores a normal data NORMAL DATA in response to a read command IRD, and outputs the stored normal data NORMAL DATA in response to a write command IWT.

The recovery information data input/output unit 240 of the semiconductor memory device 200 receives and stores a recovery information data WCDR DATA in response to the predetermined command IWCDR, and outputs a feedback recovery information data FB WCDR DATA after a certain time.

The command input pad 270 of the semiconductor memory device 200 receives the training input command IWRTR, the training output command IRDTR, and the predetermined command IWCDR.

The normal data input/output pad 260 of the semiconductor memory device 200 inputs/outputs a normal data NORMAL DATA, a normal training data NORMAL TRAIN DATA, and a feedback normal training data FB NORMAL TRAIN DATA.

The recovery information data input/output pad 280 of the semiconductor memory device 200 inputs/outputs a recovery information data WCDR DATA, a feedback recovery information data FB WCDR DATA, a recovery information training data WCDR TRAIN DATA, and a feedback recovery information training data FB WCDR TRAIN DATA.

The clock input pad 290 of the semiconductor memory device 200 receives the source clock ISCK.

Since the semiconductor memory device 200 and the semiconductor memory device controller 300 have the above-described structures, a clock transfer path 430, a command transfer path 400, a normal data transfer path 410, and a recovery information data transfer path 420 may be disposed between the semiconductor memory device 200 and the semiconductor memory device controller 300. The clock transfer path 430 transfers the source clock ISCK. The command transfer path 400 transfers the training input command IWRTR, the training output command IRDTR, the predetermined command IWCDR. The normal data transfer path 410 transfers the normal data NORMAL DATA in response to data read/write command IWT/IRD, and transfers the normal training data NORMAL TRAIN DATA and the feedback normal training data FB NORMAL TRAIN DATA in response to the training input command IWRTR and the training output command IRDTR. The recovery information data transfer path 420 transfers the feedback recovery information data FB WCDR DATA in response to the predetermined command IWCDR, and transfers the recovery information training data WCDR TRAIN DATA and the feedback recovery information training data FB WCDR TRAIN DATA in response to the training input command IWRTR and the training output command IRDTR.

The source clock ISCK transferred through the clock transfer path 430 includes a system clock IHCK and a data clock IWCK. The system clock IHCK is used for synchronization with the training input command IWRTR, the training output command IRDTR, and the predetermined command IWCDR. The data clock IWCK is used for synchronization of a normal data NORMAL DATA, a normal training data NORMAL TRAIN DATA, a feedback normal training data FB NORMAL TRAIN DATA, a recovery information data WCDR DATA, a recovery information training data WCDR TRAIN DATA, and a feedback recovery information training data FB WCDR TRAIN DATA.

The semiconductor memory device controller 300 transfers the normal training data NORMAL TRAIN DATA generated in the normal training generation unit 335 at a moment determined according to the training input command IWRTR, which is generated in the command generation unit 302, to the semiconductor memory device 200 through the normal data input/output pad 360; controls the phase of the normal data NORMAL DATA generated in the normal data generation unit 350 and transfers the phase-controlled data to the semiconductor memory device 200 through the normal data input/output pad 360 in response to the feedback normal training data FB NORMAL TRAIN DATA, which is supplied by the semiconductor memory device 200 through the normal data input/output pad 360 at a second moment corresponding to the training output command IRDTR generated in the command generation unit 302.

The semiconductor memory device controller 300 transfers the recovery information data WCDR DATA to the semiconductor memory device 200 through the recovery information data input/output pad 280 at a first moment determined according to the predetermined command IWCDR, which is one of the signals generated in the command generation unit 302; and controls the phase of the normal data NORMAL DATA generated in the normal data generation unit 350 in response to the feedback recovery information data FB WCDR DATA applied from the semiconductor memory device 200 through the recovery information data input/output pad 280 after a certain time passes from the moment of the transfer, and transfers the phase-controlled data to the semiconductor memory device 200 through the normal data input/output pad 360.

Herein, the recovery information comparison unit 340 of the semiconductor memory device controller 300 compares a data value of the recovery information data WCDR DATA and a data value of the feedback recovery information data FB WCDR DATA, and transfers the comparison result to the normal data generation unit 350. The normal data generation unit 350 receives the comparison result and controls the phase of the normal data NORMAL DATA transferred to the semiconductor memory device 200 based on the value of the output signal of the recovery information comparison unit 340, which is a signal WCDR COMP.

The semiconductor memory device 200 receives the normal training data NORMAL TRAIN DATA from the semiconductor memory device controller 300 through the normal data input/output pad 260 at a first moment determined based on the training input command IWRTR applied through the command input pad 270, and transfers a feedback normal training data FB NORMAL TRAIN DATA through the normal data input/output pad 260 at a second moment determined based on the training output command IRDTR, which is applied through the normal data input/output pad 260, and transfers the feedback normal training data FB NORMAL TRAIN DATA to the semiconductor memory device controller 300.

The semiconductor memory device 200 receives the recovery information data WCDR DATA from the semiconductor memory device controller 300 through the recovery information data input/output pad 280 at a first moment determined based on the predetermined command IWCDR, which is one of the signals generated in the command generation unit 302, and transfers the feedback recovery information data FB WCDR DATA to the semiconductor memory device controller 300 through the recovery information data input/output pad 280 after a certain time passes from the moment of receiving the recovery information data WCDR DATA.

The recovery information training data WCDR TRAIN DATA and the normal training data NORMAL TRAIN DATA which are transferred from the semiconductor memory device controller 300 to the semiconductor memory device 200 are in a state where the data window is scanned based on an edge of the source clock ISCK.

Figure 12:
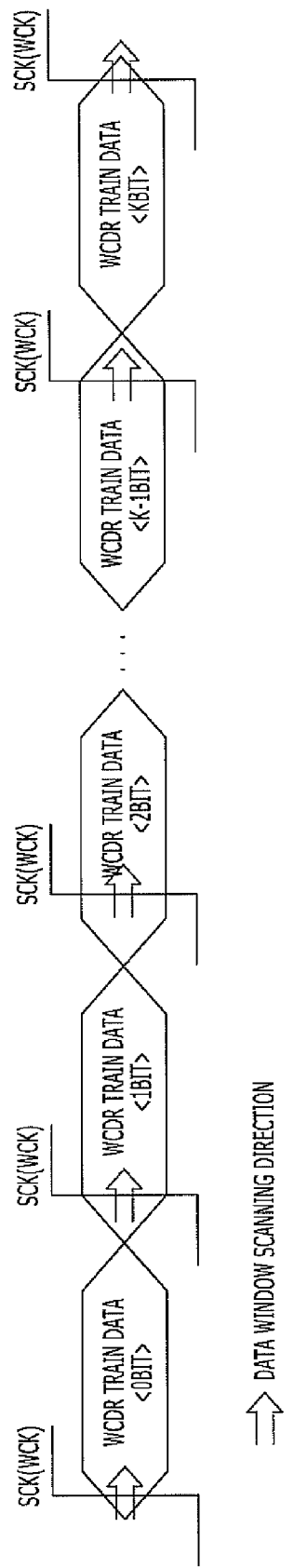
FIG. 12 illustrates an operation of applying a data in the state of a data window being scanned based on the edge of a source clock in accordance with an exemplary embodiment of the present invention.

A method of applying a signal by scanning its data window based on an edge of a source clock ISCK, which is a method of transferring the recovery information training data WCDR TRAIN DATA and the normal training data NORMAL TRAIN DATA between the semiconductor memory device controller 300 and the semiconductor memory device 200, is described herein with reference to FIG. 12.

According to the method, a point corresponding to the edge of the source clock ISCK is sequentially changed at a predetermined interval from a starting point to an end point within the range of a data window corresponding to a plurality of bits, which are included in each of the normal training data NORMAL TRAIN DATA and the recovery information training data WCDR TRAIN DATA.

When the normal training data NORMAL TRAIN DATA and the recovery information training data WCDR TRAIN DATA provided through a method of scanning their data windows are stored in a predetermined space inside the semiconductor device under the assumption that the edge of the source clock ISCK is a center point of each data window, and the data values of the normal training data NORMAL TRAIN DATA and the recovery information training data WCDR TRAIN DATA are detected in the semiconductor memory device controller 300, it is possible to detect from the detection result the location of the exact center point corresponding to the edge of the source clock ISCK in the data window of the normal training data NORMAL TRAIN DATA and the recovery information training data WCDR TRAIN DATA, which are transferred between the semiconductor memory device 200 and the semiconductor memory device controller 300.

As for the recovery information data WCDR DATA transferred from the semiconductor memory device controller 300 to the semiconductor memory device 200, the edges of the data windows are synchronized with the edge of the source clock ISCK. As for the training input command IWRTR and the training output command IRDTR and the predetermined command IWCDR and the normal data NORMAL DATA, the centers of the data windows are synchronized with the edge of the source clock ISCK.

As for the feedback recovery information training data FB WCDR TRAIN DATA and the feedback normal training data FB NORMAL TRAIN DATA and the feedback recovery information data FB WCDR DATA and the normal data NORMAL DATA, which are transferred from the semiconductor memory device 200 to the semiconductor memory device controller 300, the edges of the data windows are synchronized with the edge of the source clock ISCK.

The write command IWT and the read command IRD transferred from the semiconductor memory device controller 300 to the semiconductor memory device 200 are included in the predetermined command IWCDR. The predetermined command IWCDR may include not only the write command IWT and the read command IRD, but also diverse operation mode commands for a semiconductor memory device. In particular, a predetermined command IWCDR may include an auto-refresh operation mode entering command, which is one of the operation modes that uses the is most power in a semiconductor memory device, or conversely may include a stand-by operation mode entering command, which is one of the operation modes that uses the least power in a semiconductor memory device.

The reason why the predetermined command IWCDR can include the write command IWT, the read command IRD, and other diverse operation mode commands for a semiconductor memory device is that a command decoder 204 is designed to toggle the predetermined command IWCDR when the write command IWT, the read command IRD, and other diverse operation mode commands for a semiconductor memory device are toggled in a case where the recovery information enable signal WCDR_ENABLE is enabled and the semiconductor memory device enters the recovery information operation mode or the recovery information training operation mode.

For the second data input/output unit 220 and the recovery information data input/output unit 240 to operate, the recovery information enable signal WCDR_ENABLE should be enabled. Herein, the enablement moment, the disablement moment, and the length of the enabled duration of the recovery information enable signal WCDR_ENABLE are predetermined in the memory register set (MRS) 202 inside the semiconductor memory device 200.

Figure 10:
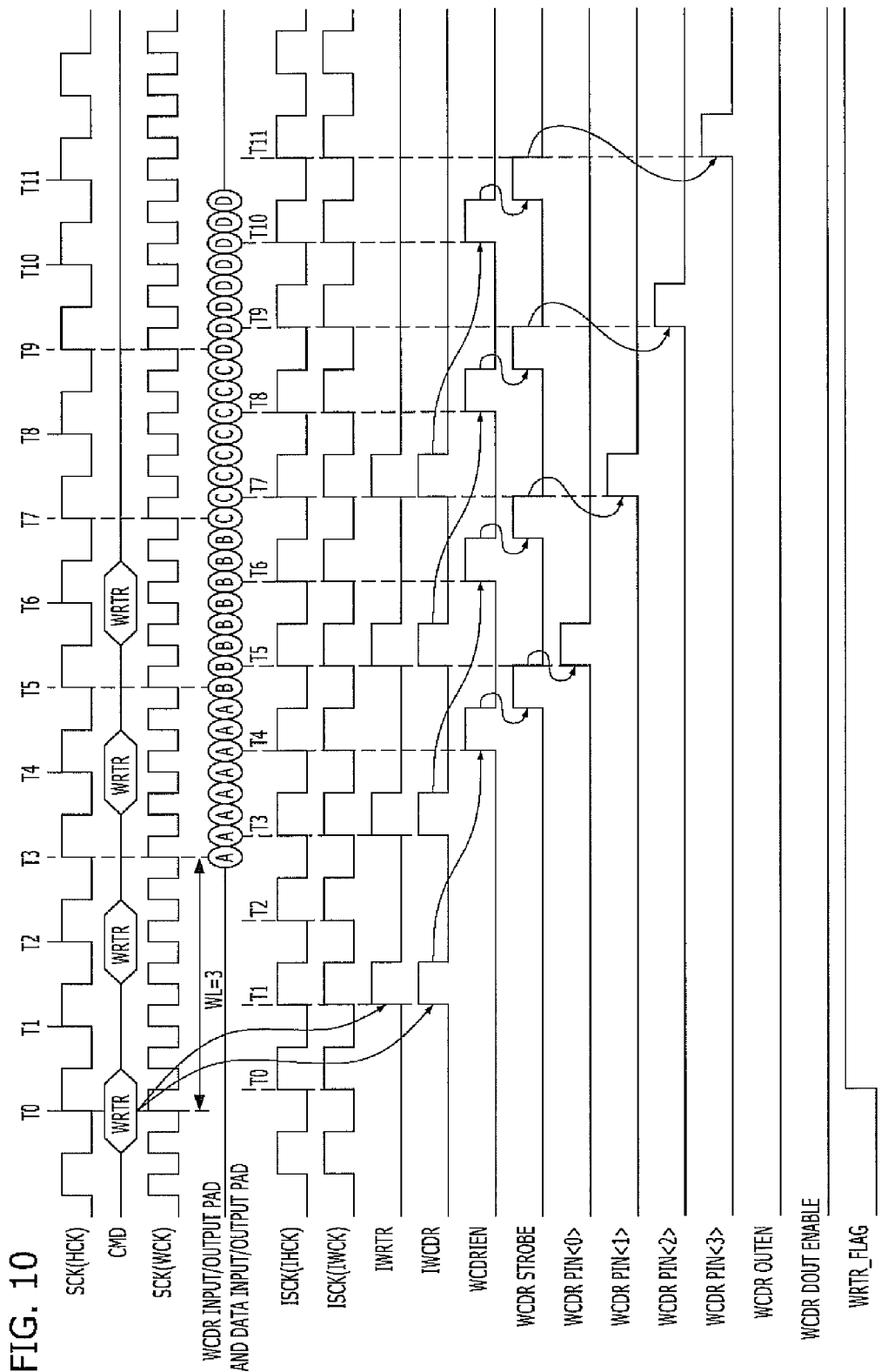
FIG. 10 is a timing diagram illustrating an operation of applying a training input command to a semiconductor memory device in accordance with an exemplary embodiment of the present invention.

FIG. 10 is a timing diagram illustrating an operation of applying a training input command to a semiconductor memory device in accordance with an exemplary embodiment of the present invention.

Referring to FIG. 10, a 'WCDR' command is applied at a moment 'T0,' a moment 'T2,' a moment 'T4,' and a moment 'T6' of the source clock SCK or ISCK in the semiconductor memory device according to an exemplary embodiment of the present invention. Accordingly, it may be seen that the training input command IWRTR is toggled at a moment 'T1,' a moment 'T3,' a moment 'T5,' and a moment 'T7' of the source clock SCK or ISCK.

The reason why the toggling moment of the training input command IWRTR is later than the moment when the 'WCDR' command is inputted is that the command decoder 204 needs operation time. Also, since the internal source clock ISCK is generated by buffering an external source clock SCK, the internal source clock ISCK is toggled a little later than the external source clock SCK. However, since this does not change the operation of the semiconductor memory device, the internal source clock ISCK and the external source clock SCK will not be distinguished in the description of the present patent specification.

Since the write latency WL is assumed to be '3' after the training input command IWRTR is toggled, the recovery information training data WCDR TRAIN DATA, whose data window is scanned based on an edge of each source clock ISCK, is applied through the recovery information data input/output pad 185 from the moment 'T3,' the moment 'T5,' the moment 'T7,' and the moment 'T9' of the source clock SCK or ISCK corresponding to a determined first moment, as soon as the normal training data NORMAL TRAIN DATA is applied through the normal data input/output pad 181.

To be specific, the normal input counter 1026 starts counting the number of toggling times of the source clock ISCK, in response to a toggling of the training input command IWRTR as soon as the recovery information input counter 1221 starts counting the number of toggling times of the source clock ISCK. Herein, since the write latency WL is assumed to be '3,' the recovery information input counter 1221 and the normal input counter 1026 count the number of times that the source clock ISCK is toggled three times from the moment 'T1,' the moment 'T3,' the moment 'T5,' and the moment 'T7,' which are moments when the training input command IWRTR is toggled, and toggle a recovery information input enable signal WCDRINEN and a normal input enable signal WTEN at the moment 'T4,' a moment 'T6,' a moment 'T8,' and a moment 'T10' of the source clock ISCK when the counting operation is ended.

As described above, the recovery information training data WCDR TRAIN DATA applied through the recovery information data input/output pad 185 is latched in parallel by delaying the recovery information input enable signal WCDRINEN toggled at the moment 'T4,' a moment 'T6,' a moment 'T8,' and a moment 'T10' of the source clock ISCK and toggling the recovery information input latch signal WCDR STROBE. Although not directly illustrated in the drawing, the normal training data NORMAL TRAIN DATA, which is applied through the normal data input/output pad 181, is latched in parallel by using a normal input latch signal NORMAL STROBE (not shown), which is obtained by delaying the normal input enable signal WTEN by a certain time.

Herein, the latched normal training data NORMAL TRAIN DATA and recovery information training data WCDR TRAIN DATA are inputted in series from the moment 'T3,' the moment 'T5,' the moment 'T7,' and the moment 'T9' of the source clock ISCK and become data values completed with parallelization between the moment 'T4' and the moment 'T5', between the moment 'T6' and the moment 'T7,' between the moment 'T8' and the moment 'T9,' and between the moment 'T10' and the moment 'T11,' respectively.

Herein, the time difference between the recovery information input enable signal WCDRINEN and the recovery information input latch signal WCDR STROBE and the difference between the normal input enable signal WTEN and the normal input latch signal NORMAL STROBE (not shown) are time asynchronized with the source clock ISCK, and they are values that may become different according to burst lengths BL of the normal training data NORMAL TRAIN DATA and the recovery information training data WCDR TRAIN DATA.

Subsequently, the normal training data NORMAL TRAIN DATA and the recovery information training data WCDR TRAIN DATA, which are latched between the moment 'T4' and the moment 'T5,' between the moment 'T6' and the moment 'T7,' between the moment 'T8' and the moment 'T9,' and between the moment 'T10' and the moment 'T11,' are respectively stored in a predetermined space inside the normal training data input unit 1023 and a recovery information data storage unit 1264 in parallel by sequentially toggling first internal input strobe signals WCDR PIN<0>, WCDR PIN<1>, WCDR PIN<2>, and WCDR PIN<3> from the moment 'T5,' the moment 'T7,' the moment 'T9,' and the moment 'T11' of the source clock ISCK in response to a toggling of the recovery information input latch signal WCDR STROBE and the normal input latch signal NORMAL STROBE (not shown).

The timing diagram illustrated in the drawing assumes a state where semiconductor memory device operates corresponding to the training input command IWRTR. Thus, the first internal input strobe signal WCDR PIN<0:M> (where M=3 in the example shown in the drawing) is toggled in response to the toggling of the recovery information input latch signal WCDR STROBE, and if it operates corresponding to the predetermined command IWCDR, a second internal input strobe signal WCDR PIN<0:N> (where N=3 in the example shown in the drawing) is toggled in response to the toggling of the recovery information input latch signal WCDR STROBE.

In short, even when the semiconductor memory device operates corresponding to the predetermined command IWCDR, the recovery information data WCDR DATA is inputted and stored through is the same timing diagram as illustrated in FIG. 10.

Also, when the semiconductor memory device operates according to the write command IWT (which may be included in the predetermined command IWCDR), the normal data NORMAL DATA and the recovery information data WCDR DATA may be inputted and stored through the same timing diagram as illustrated in FIG. 10.

As described above, when the normal training data NORMAL TRAIN DATA, the recovery information training data WCDR TRAIN DATA, the normal data NORMAL DATA, and the recovery information data WCDR DATA are applied to the semiconductor memory device, command signals, such as the predetermined command IWCDR including the training input command IWRTR and the write command IWT, are applied at a moment when a time defined by a write latency WL passes from the moment that they are applied.

If there are any differences, the normal training data NORMAL TRAIN DATA and the recovery information training data WCDR TRAIN DATA are applied in a state where their data windows are scanned based on an edge of the source clock ISCK, and the normal data NORMAL DATA is applied in synchronization with the center of the source clock ISCK, while the recovery information data WCDR DATA is applied in synchronization with an edge of the source clock ISCK.

Herein, the method of applying a data by scanning a data window based on an edge of the source clock ISCK, which is the method of applying the normal training data NORMAL TRAIN DATA and the recovery information training data WCDR TRAIN DATA, is as described with reference to FIG. 12.

In other words, among the range of a data window corresponding to a plurality of bits included in each of the normal training data NORMAL TRAIN DATA and the recovery information training data WCDR TRAIN DATA, a point corresponding to the edge of the source clock ISCK is sequentially changed at a certain interval from a starting point to an end point.

As described above, when the normal training data NORMAL TRAIN DATA and the recovery information training data WCDR TRAIN DATA are stored in a predetermined space inside the semiconductor memory device and the values of the normal training data NORMAL TRAIN DATA and the recovery information training data WCDR TRAIN DATA are detected in the semiconductor memory device controller under the assumption that the edge of the source clock ISCK is the center of the data window, it is possible to detect the exact location of the center corresponding to the edge of the source clock ISCK in the data windows of the normal training data NORMAL TRAIN DATA and the recovery information training data WCDR TRAIN DATA transferred between the semiconductor memory device and the semiconductor memory device controller based on the detection result.

Figure 11:
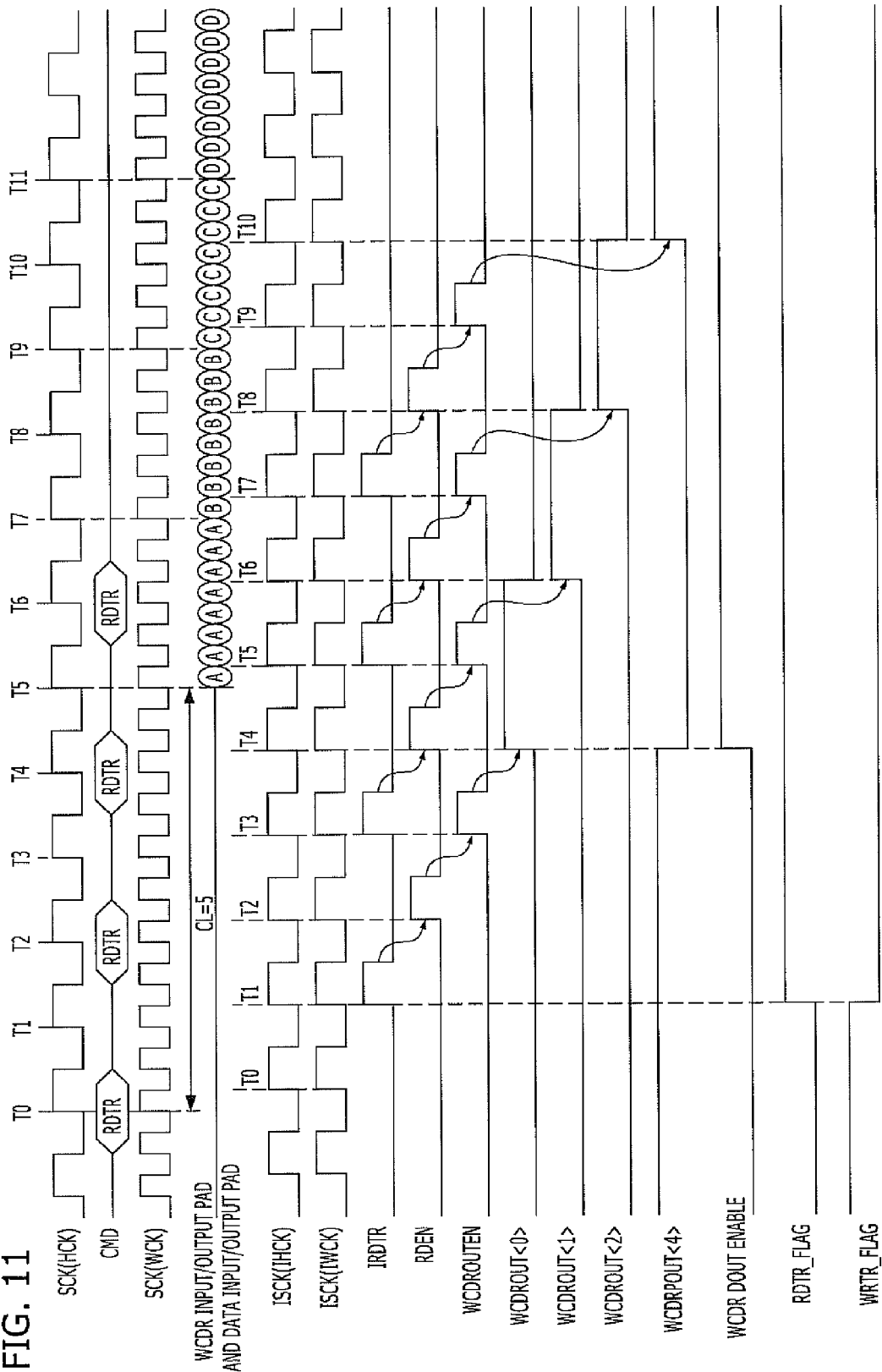
FIG. 11 is a timing diagram illustrating an operation of applying a training output command to a semiconductor memory device in accordance with an exemplary embodiment of the present invention.

FIG. 11 is a timing diagram illustrating an operation of applying a training output command to a semiconductor memory device in accordance with an exemplary embodiment of the present invention.

Referring to FIG. 11, in the semiconductor memory device according to an exemplary embodiment of the present invention, an 'RDTR' command is applied at a moment 'T0,' a moment 'T2,' a moment 'T4,' and a moment 'T6' of a source clock ISCK, and accordingly, a training output command IRDTR is togged at a moment 'T1,' a moment 'T3,' a moment 'T5,' and a moment 'T7' of a source clock ISCK.

The reason why the toggling moment of the training input command IWRTR is later than the moment when the 'RDTR' command is inputted is that the command decoder 204 needs time to operate. Also, since the internal source clock ISCK is generated by buffering an external source clock SCK, the internal source clock ISCK is toggled a little later than the external source clock SCK. However, since this does not change the operation of the semiconductor memory device, the internal source clock and the external source clock will not be distinguished in the description of the present patent specification.

Since the column latency CL is assumed to be '5' after the training output command IRDTR is toggled, the feedback recovery information training data FB WCDR TRAIN DATA, whose data window is scanned based on an edge of each source clock ISCK, is outputted through the recovery information data input/output pad 185 from the moment 'T5,' the moment 'T7,' the moment 'T9,' and the moment 'T11,' of the source clock SCK or ISCK corresponding to a determined second moment, as soon as the feedback normal training data FB NORMAL TRAIN DATA is applied through the normal data input/output pad 181.

To be specific, the normal output counter 1021 starts counting the number of toggling times of the source clock ISCK in response to a toggling of the training output command IRDTR. Herein, since the column latency CL is assumed to be '5,' the recovery information input counter 1221 counts the number of times that the source clock ISCK is toggled one time from the moment 'T1,' the moment 'T3,' the moment 'T5,' and the moment 'T7' of the source clock ISCK, which are moments when the training output command IRDTR is toggled, and toggles a normal output enable signal RDEN at a moment 'T2,' a moment 'T4,' a moment 'T6,' and a moment 'T8' of the source clock ISCK when the counting operation is ended.

Herein, the reason why the normal output counter 1021 counts the number of toggling times of the source clock ISCK only once, although the column latency CL is '5,' is that the column latency CL requires a minimum amount of time for receiving a command and actually outputting a data therein. In other words, it is assumed in the drawing that the minimum time required for internal preparation from the reception of a command and the actual output of a data is a time corresponding to three periods of the source clock ISCK. Therefore, when the column latency CL is '5,' the normal output counter 1021 needs a time corresponding to one period of the source clock ISCK to wait while counting.

The first and second recovery information output enable signal toggling controllers 1224 toggle a recovery information output enable signal WCDROUTEN at a moment 'T3,' a moment 'T5,' a moment 'T7,' and a moment 'T9' of the source clock ISCK in response to a normal output enable signal RDEN toggled at a moment 'T2,' a moment 'T4,' a moment 'T6,' and a moment 'T8' of the source clock ISCK.

Likewise, the normal output strobe signal generator 1022 toggles (not directly illustrated in the drawing) a normal output strobe signal DOUT STROBE at the moment 'T3,' the moment 'T5,' the moment 'T7,' and the moment 'T9' of the source clock ISCK in response to a normal output enable signal RDEN toggled at a moment 'T2,' a moment 'T4,' a moment 'T6,' and a moment 'T8' of the source clock ISCK.

As described above, the first internal output strobe signals WCDR POUT<0>, WCDR POUT<1>, WCDR POUT<2>, and WCDR POUT<3> are sequentially enabled at the moment 'T4,' the moment 'T6,' the moment 'T8,' and the moment 'T10' of the source clock ISCK in response to the recovery information output enable signal WCDROUTEN toggled at the moment 'T3,' the moment 'T5,' the moment 'T7,' and the moment 'T9' of the source clock ISCK, and the recovery information training data WCDR TRAIN DATA is outputted in parallel to the recovery information data storage unit 1264.

Likewise, normal data internal output strobe signals (not directly illustrated in the drawing) are sequentially enabled at the moment 'T4,' the moment 'T6,' the moment 'T8,' and the moment 'T10' of the source clock ISCK in response to the normal output strobe signal DOUT STROBE toggled at the moment 'T3,' the moment 'T5,' the moment 'T7,' and the moment 'T9' of the source clock ISCK, and the normal training data NORMAL TRAIN DATA stored in parallel in the predetermined space inside the normal training data input unit 1023 is outputted in parallel.

The recovery information training data WCDR TRAIN DATA outputted in parallel is serialized through a recovery information serializing unit 1252, and then a serialized feedback recovery information training data FB WCDR TRAIN DATA is outputted through a recovery information data input/output pad 185 in response to a recovery information output driver enable signal WCDR DOUT ENABLE.

Herein, the recovery information output driver enable signal WCDR DOUT ENABLE is enabled in response to the recovery information output enable signal WCDROUTEN toggled at the moment 'T3,' the moment 'T5,' the moment 'T7,' and the moment 'T9' of the source clock ISCK, just like the first internal output strobe signals WCDR POUT<0>, WCDR POUT<1>, WCDR POUT<2>, and WCDR POUT<3>. The recovery information output driver enable signal WCDR DOUT ENABLE is always enabled in the durations where the first internal output strobe signals WCDR POUT<0>, WCDR POUT<1>, WCDR POUT<2>, and WCDR POUT<3> maintain the enabled state. Thus, the recovery information output driver enable signal WCDR DOUT ENABLE continues to be enabled from the moment 'T4' of the source clock ISCK, which is a moment when the first internal output strobe signals WCDR POUT<0>, WCDR POUT<1>, WCDR POUT<2>, and WCDR POUT<3> start to be enabled.

Since the timing diagram shown in the drawing assumes a state of operation corresponding to the training output command IRDTR, the first internal output strobe signals WCDR POUT<0:M> (where M=3 in the example shown in the drawing) are toggled in response to a toggling of the recovery information output enable signal WCDROUTEN. However, when in a state of operation corresponding to the predetermined command IWCDR, and not the training output command IRDTR, the second internal output strobe signals WCDR POUT<0:N> (where N=3 in the example shown in the drawing) are toggled in response to a toggling of the recovery information output enable signal WCDROUTEN.

Of course, when in a state of operation corresponding to the predetermined command IWCDR, the feedback recovery information data FB WCDR DATA is outputted through a timing diagram different from that of FIG. 11.

In other words, when the recovery information data WCDR DATA is inputted/outputted in a state of operation corresponding to the predetermined command IWCDR, the recovery information data WCDR DATA is inputted, according to the timing diagram shown in FIG. 10, in response to the training input command IWRTR, stored, and the stored recovery information data WCDR DATA is outputted as the feedback recovery information data FB WCDR DATA at a moment when the period of the source clock ISCK corresponding to the recovery information latency WCDRL passes.

However, when semiconductor memory device is in a state of operation corresponding to the read command IRD (included in the predetermined command IWCDR), the normal data NORMAL DATA is outputted according to the same timing diagram as illustrated in FIG. 11.

As described above, when the normal training data NORMAL TRAIN DATA, or the recovery information training data WCDR TRAIN DATA, or the normal data NORMAL DATA are outputted from the semiconductor memory device, command signals, which are the predetermined command IWCDR including the training input command IWRTR and the write command IWT, are outputted at a moment when a time defined by a column latency passes from a moment when the command signals are applied.

On the other hand, when the recovery information data WCDR DATA is outputted from the semiconductor memory device, it is outputted at a moment when a time, defined by an internally determined recovery information latency WCDRL, passes from a moment when the recovery information data WCDR DATA is stored in the semiconductor memory device.

Also, when the normal training data NORMAL TRAIN DATA, or the recovery information training data WCDR TRAIN DATA, the normal data NORMAL DATA, or the recovery information data WCDR DATA are outputted from the semiconductor memory device, they are outputted in a state where the edges of their data windows are synchronized with an edge of the source clock ISCK.

According to one exemplary embodiment of the present invention, although the phase of a normal data is changed due to a change in the operation temperature or operation power of a semiconductor system, which includes a semiconductor memory device and a semiconductor memory device controller, the normal data can be stably inputted/outputted at all times between the semiconductor memory device controller and the semiconductor memory device by sensing the change in the phase based on a recovery information data, which is inputted/outputted between the semiconductor memory device controller and the semiconductor memory device at the same timing that the normal data is inputted/outputted, and correcting the phase of the normal data based on the sensing result.

Also, the reliability of the recovery information data WCDR DATA transferred between the semiconductor memory device controller and the semiconductor memory device may be improved by training the phases of a recovery information training data WCDR TRAIN DATA and a source clock ISCK so as to control the phase of the recovery information data WCDR DATA in a training operation performed in the initial state of an operation of the semiconductor system, as well as training the phases of the normal training data NORMAL TRAIN DATA and the source clock ISCK so as to control the phase of the normal data NORMAL DATA.

When the operation temperature or operation power of the semiconductor system is altered, an operation for correcting the phase of the normal data NORMAL DATA may be performed based on the recovery information data WCDR DATA, and thus, the operation for correcting the phase of the normal data can be performed with an improved reliability.

While the present invention has been described with respect to the specific embodiments, it will be apparent to those skilled in the art that various changes and modifications may be made without departing from the spirit and scope of the invention as defined in the following claims.

For example, modifications to the location and kinds of the logic gates and transistors exemplified in the above-described embodiment may be realized based on the polarity of an input signal.

What is claimed is:

1. A semiconductor system comprising:
 a semiconductor memory device; and
 a semiconductor memory device controller,
 wherein the semiconductor memory device and the semiconductor memory device controller between which a normal data and a recovery information data are transferred,
 wherein the semiconductor memory device controller compares a recovery information training data with a feedback recovery information training data to produce a comparison result, and controls a phase of the recovery information data transferred to the semiconductor memory device based on the comparison result, and
 wherein the semiconductor memory device receives the recovery information training data from the semiconductor memory device controller at a predetermined first moment and transfers the feedback recovery information training data to the semiconductor memory device controller at a predetermined second moment.

2. The semiconductor system of claim 1, wherein semiconductor memory device controller compares a normal training data with a feedback normal training data to produce a comparison result, and controls a phase of the normal data transferred to the semiconductor memory device based on the comparison result.

3. The semiconductor system of claim 2, wherein the semiconductor memory device receives the normal training data from the semiconductor memory device controller at the first moment, and transfers the feedback normal training data at the second moment.

4. The semiconductor system of claim 3, wherein the semiconductor memory device controller compares the recovery information data with the feedback recovery information data to produce a comparison result, and controls a phase of the normal data transferred to the semiconductor memory device based on the comparison result.

5. The semiconductor system of claim 4, wherein the semiconductor memory device receives the recovery information data from the semiconductor memory device controller at the first moment, and transfers the feedback recovery information data to the semiconductor memory device controller after a predetermined time.

6. The semiconductor system of claim 5, wherein the recovery information training data and the normal training data transferred from the semiconductor memory device controller to the semiconductor memory device have their data windows scanned based on an edge of the source clock,
 the recovery information data has an edge of a data window synchronized with an edge of the source clock, and the normal data has a center of a data window synchronized with an edge of the source clock, and
 the feedback recovery information training data and the feedback normal training data, and the recovery information data and the normal data, which are transferred from the semiconductor memory device to the semiconductor memory device controller, have edges of their data windows synchronized with an edge of the source clock.

7. The semiconductor system of claim 6, wherein the semiconductor memory device controller comprises:
 a recovery information training comparison unit configured to compare a data value of the recovery information training data with a data value of the feedback recovery information training data to produce a comparison result, and generate a recovery information training comparison signal based on the comparison result; and
 a recovery information data generation unit configured to generate the recovery information data with a phase changed based on the recovery information training comparison signal.

8. The semiconductor system of claim 7, wherein the semiconductor memory device controller further comprises:
 a normal training comparison unit configured to compare a data value of the normal training data with a data value of the feedback normal training data to produce a comparison result, and generate a normal training comparison signal based on the comparison result;
 a recovery information comparison unit configured to compare a data value of the recovery information data with a data value of the feedback recovery information data to produce a comparison result, and generate a recovery information comparison signal based on the comparison result; and
 a normal data generation unit configured to generate the normal data with a phase changed based on the normal training comparison signal or the recovery information comparison signal.

9. The semiconductor system of claim 8, wherein the semiconductor memory device comprises:
 a first data input/output unit configured to receive and store the normal training data at the first moment, and output the feedback normal training data at the second moment; and
 a second data input/output unit configured to receive and store a recovery information training data at the first moment, and output the feedback recovery information training data at the second moment.

10. The semiconductor system of claim 9, wherein the semiconductor memory device further comprises:
 a normal data input/output unit configured to receive and store the normal data at the first moment, and output the stored normal data at the second moment; and
 a recovery information data input/output unit configured to receive and store the recovery information data at the first moment, and output the feedback recovery information data after a predetermined time.

11. The semiconductor system of claim 10, further comprising:
 a clock transfer path configured to transfer the source clock between the semiconductor memory device and the semiconductor memory device controller;
 a normal data transfer path configured to transfer the normal data, the normal training data, and the feedback normal training data between the semiconductor memory device and the semiconductor memory device controller; and
 a recovery information data transfer path configured to transfer the recovery information data, the feedback recovery information data, the recovery information training data, and the feedback recovery information training data between the semiconductor memory device and the semiconductor memory device controller.

12. The semiconductor system of claim 11, wherein the semiconductor memory device controller further comprises:
    a normal data input/output pad configured to input/output the normal data, the normal training data, and the feedback normal training data;
    a recovery information data input/output pad configured to input/output the recovery information data, the feedback recovery information data, the recovery information training data, and the feedback recovery information training data; and
    a clock output pad configured to output the source clock.

13. The semiconductor system of claim 12, wherein the semiconductor memory device further comprises:
    a normal data input/output pad configured to input/output the normal data, the normal training data, and the feedback normal training data;
    a recovery information data input/output pad configured to input/output the recovery information data, the feedback recovery information data, the recovery information training data, and the feedback recovery information training data; and
    a clock input pad configured to receive the source clock.

14. A semiconductor system, comprising:
    a semiconductor memory device controller configured to control a phase of a recovery information data transferred to the semiconductor memory device in a normal mode in response to a feedback recovery information training data transferred from the semiconductor memory device based on a recovery information training data transferred to the semiconductor memory device in a training mode; and
    a semiconductor memory device configured to store the recovery information training data transferred from the semiconductor memory device controller in the training mode for a first time period and feed-back the stored recovery information training data as the feedback recovery information training data, and to store the recovery information data transferred from the semiconductor memory device controller in the normal mode for a second time period and feed-back the stored recovery information data as the feedback recovery information data.

15. The semiconductor system of claim 14, wherein the semiconductor memory device controller controls a phase of a normal data transferred to the semiconductor memory device in the normal mode in response to a feedback normal training data applied from the semiconductor memory device based on a normal training data transferred to the semiconductor memory device in the training mode.

16. The semiconductor system of claim 15, wherein the semiconductor memory device stores the normal training data applied from the semiconductor memory device controller in the training mode for the first time period and feeds-back the stored normal training data as the feedback normal training data.

17. The semiconductor system of claim 16, wherein the semiconductor memory device controller controls a phase of a normal data transferred to the semiconductor memory device in the normal mode in response to the feedback recovery information data applied from the semiconductor memory device based on the recovery information data transferred to the semiconductor memory device in the normal mode.

18. The semiconductor system of claim 17, wherein in the semiconductor memory device controller, the recovery information training data and the normal training data transferred to the semiconductor memory device have data windows scanned based on an edge of a source clock, and the recovery information data has an edge of a data window synchronized with the edge of the source clock; and
    in the semiconductor memory device, the feedback recovery information training data and the feedback normal training data and the feedback recovery information data and the normal data transferred to the semiconductor memory device controller have edges of data windows synchronized with the edge of the source clock.

19. The semiconductor system of claim 18, wherein the semiconductor memory device controller comprises:
    a recovery information training comparison unit configured to compare a data value of the recovery information training data with a data value of the feedback recovery information training data in the training mode to produce a comparison result, and generate a recovery information training comparison signal based on the comparison result; and
    a recovery information data generation unit configured to generate the recovery information data with a phase changed based on the recovery information training comparison signal in the normal mode.

20. The semiconductor system of claim 19, wherein the semiconductor memory device controller further comprises:
    a normal training comparison unit configured to compare a data value of the normal training data with a data value of the feedback normal training data in the training mode to produce a comparison result, and generate a normal training comparison signal based on the comparison result;
    a recovery information comparison unit configured to compare a data value of the recovery information data with a data value of the feedback recovery information data in the normal mode to produce a comparison result, and generate a recovery information comparison signal based on the comparison result; and
    a normal data generation unit configured to generate the normal data with a phase changed based on the normal training comparison signal or the recovery information comparison signal in the normal mode.

21. The semiconductor system of claim 20, wherein the semiconductor memory device comprises:
    a first data input/output unit configured to receive and store the normal training data for the first time period in the training mode, and output the feedback normal training data; and
    a second data input/output unit configured to receive and store the recovery information training data for the first time period in the training mode, and output the feedback recovery information training data.

22. The semiconductor system of claim 21, wherein the semiconductor memory device further comprises:
    a normal data input/output unit configured to receive and store the normal data in a core region in the normal mode, and output the stored normal data; and
    a recovery information data input/output unit configured to receive and store the recovery information data for the second time period in the normal mode, and output the feedback recovery information data.

23. The semiconductor system of claim 22, further comprising:
a clock transfer path configured to transfer the source clock between the semiconductor memory device and the semiconductor memory device controller;
a normal data transfer path configured to transfer the normal data, the normal training data, and the feedback normal training data between the semiconductor memory device and the semiconductor memory device controller; and
a recovery information data transfer path configured to transfer the recovery information data, the feedback recovery information data, the recovery information training data, and the feedback recovery information training data between the semiconductor memory device and the semiconductor memory device controller.

24. The semiconductor system of claim 23, wherein the semiconductor memory device controller further comprises:
a normal data input/output pad configured to input/output the normal data, the normal training data, and the feedback normal training data;
a recovery information data input/output pad configured to input/output the recovery information data, the feedback recovery information data, the recovery information training data, and the feedback recovery information training data; and
a clock output pad configured to output the source clock.

25. The semiconductor system of claim 24, wherein the semiconductor memory device further comprises:
a normal data input/output pad configured to input/output the normal data, the normal training data, and the feedback normal training data;
a recovery information data input/output pad configured to input/output the recovery information data, the feedback recovery information data, the recovery information training data, and the feedback recovery information training data; and
a clock input pad configured to receive the source clock.

26. A method for operating a semiconductor system including a semiconductor memory device and a semiconductor memory device controller, comprising:
transferring a training input command generated in the semiconductor memory device controller to the semiconductor memory device and transferring a recovery information training data generated in the semiconductor memory device controller to the semiconductor memory device at a first time by scanning a data window based on an edge of a source clock;
storing the recovery information training data transferred to the semiconductor memory device inside the semiconductor memory device;
transferring a training output command generated in the semiconductor memory device controller to the semiconductor memory device and outputting the stored recovery information training data as a feedback recovery information training data to the semiconductor memory device controller at a second time in a state that an edge of a data window is synchronized with the edge of the source clock; and
comparing a data value of the feedback recovery information training data outputted to the semiconductor memory device controller with the recovery information training data inside the semiconductor memory device controller to produce a comparison result, and controlling a phase of a recovery information data generated in the semiconductor memory device controller and transferred to the semiconductor memory device based on the comparison result.

27. The method of claim 26, further comprising:
transferring a write command generated in the semiconductor memory device controller to the semiconductor memory device and transferring a first normal data generated in the semiconductor memory device controller to the semiconductor memory device at the first time in a state where a center of a data window is synchronized with the edge of the source clock; and
transferring a read command generated in the semiconductor memory device controller to the semiconductor memory device and transferring a second normal data stored inside the semiconductor memory device to the semiconductor memory device controller after the second time in a state where an edge of a data window is synchronized with the edge of the source clock.

28. The method of claim 27, further comprising:
transferring a predetermined command generated in the semiconductor memory device controller, including the write command and the read command and excluding the training input command and the training output command to the semiconductor memory device, and transferring the recovery information data generated in the semiconductor memory device controller to the semiconductor memory device after the first time in a state where an edge of a data window is synchronized with the edge of the source clock;
storing the recovery information data transferred to the semiconductor memory device inside the semiconductor memory device;
transferring the recovery information data stored in the semiconductor memory device as a feedback recovery information data to the semiconductor memory device controller in a state where an edge of a data window is synchronized with the edge of the source clock, after the storing of the recovery information data is completed and a predetermined time elapses; and
comparing a data value of the feedback recovery information data transferred to the semiconductor memory device controller with the recovery information data inside the semiconductor memory device controller to produce a comparison result, and controlling a phase of the first normal data based on the comparison result.

29. The method of claim 28, further comprising:
outputting the training input command, the training output command, and the predetermined command from a command output pad provided to the semiconductor memory device controller to a command input pad provided to the semiconductor memory device;
transferring the first normal data, the second normal data, the normal training data, and the feedback normal training data between the normal data input/output pad provided to the semiconductor memory device controller and the normal data input/output pad provided to the semiconductor memory device;
transferring the recovery information data, the feedback recovery information data, the recovery information training data, and the feedback recovery information training data between the normal data input/output pad provided to the semiconductor memory device controller and the normal data input/output pad provided to the semiconductor memory device; and transferring the source clock from a clock output pad provided to the semiconductor memory device controller to a clock input pad provided to the semiconductor memory device.

30. The method of claim 29, wherein the source clock comprises:
 a system clock for synchronizing the training input command, the training output command, and the predetermined command; and
 a data clock for synchronizing the normal data, the normal training data, the feedback normal training data, the recovery information, the feedback recovery information data, the recovery information training data, and the feedback recovery information training data.

* * * * *